(12) United States Patent
Suzuki et al.

(10) Patent No.: US 7,701,983 B2
(45) Date of Patent: Apr. 20, 2010

(54) TUNABLE RESONATOR, TUNABLE LIGHT SOURCE USING THE SAME, AND METHOD FOR TUNING WAVELENGTH OF MULTIPLE RESONATOR

(75) Inventors: Kouichi Suzuki, Tokyo (JP); Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/367,099

(22) Filed: Mar. 3, 2006

(65) Prior Publication Data

US 2006/0198401 A1 Sep. 7, 2006

(30) Foreign Application Priority Data

Mar. 3, 2005 (JP) ............................. 2005-059645
Feb. 28, 2006 (JP) ............................. 2006-053840

(51) Int. Cl.
*H01S 3/10* (2006.01)
(52) U.S. Cl. ................. 372/20; 372/29.016; 372/94
(58) Field of Classification Search ............ 372/20, 372/29.016, 29.022, 94
See application file for complete search history.

(56) References Cited

U.S. PATENT DOCUMENTS 6,411,752 B1 * 6/2002 Little et al. ................ 385/17

(Continued)

FOREIGN PATENT DOCUMENTS

EP 1 679 771 A2 7/2006

(Continued)

OTHER PUBLICATIONS

Suzuki et al., "Integrated-Optic Double-Ring Resonators with a Wide Free Spectral Range of 100 Ghz", Aug. 1995, J. of Lightwave Tech., vol. 13 No. 8, p. 1766-1771.*

(Continued)

*Primary Examiner*—Minsun Harvey
*Assistant Examiner*—Joshua King
(74) *Attorney, Agent, or Firm*—Michael Best & Friedrich LLP

(57) ABSTRACT

The object is to provide a highly reliable, high-performance, and low-price tunable light source and the like. The present invention comprises: a multiple resonator that oscillates with a wavelength where frequencies of three or more resonant elements with shifted cycles intersect; and a tunable device for controlling the resonant wavelength of the multiple resonator by simultaneously changing the respective optical path lengths of the plurality of resonant elements constituting the multiple resonator. The multiple resonator has a structure in which three resonant elements are connected in series; and provided that the optical path lengths of the resonant elements are $L_0$, $L_1$, $L_2$, Vernier orders are $M_1 > 1$, $M_2 > 1$, the optical path lengths are defined as $$L_1 = \frac{M_1}{M_1 - 1} L_0,$$
$$L_2 = \frac{M_2}{M_2 - 1} L_0,$$

phase amount "$P_M$" is the changed optical path length standardized by one-wavelength of the optical path length, and the respective phase amount "$P_M$" of the two ring resonator elements whose optical path lengths are to be changed are defined as "$P_{M1}$" and "$P_{M2}$", the tunable device controls the increase/decrease amount of the phase amount "$P_{M1}$" and "$P_{M2}$" based on a linear function with a slope of $$\frac{M_2 - 1}{M_1 - 1}.$$

8 Claims, 10 Drawing Sheets

U.S. PATENT DOCUMENTS

| | | | | |
|---|---|---|---|---|
| 6,891,865 | B1* | 5/2005 | Ma | 372/20 |
| 2001/0004411 | A1* | 6/2001 | Yariv | 385/28 |
| 2002/0054614 | A1* | 5/2002 | Jin | 372/20 |
| 2003/0128922 | A1* | 7/2003 | Kolodziejski et al. | 385/27 |
| 2003/0161631 | A1* | 8/2003 | Margalit | 398/33 |
| 2003/0202555 | A1* | 10/2003 | Liu et al. | 372/94 |
| 2003/0219045 | A1* | 11/2003 | Orenstein et al. | 372/20 |
| 2003/0231826 | A1* | 12/2003 | Boyd et al. | 385/27 |
| 2004/0202430 | A1* | 10/2004 | Scheuer et al. | 385/50 |
| 2004/0240781 | A1* | 12/2004 | Savchenkov et al. | 385/27 |
| 2006/0051010 | A1* | 3/2006 | Chu et al. | 385/5 |

FOREIGN PATENT DOCUMENTS

| | | |
|---|---|---|
| JP | 06-221858 | 8/1994 |
| JP | 07-82131 | 9/1995 |
| JP | 09-092934 | 4/1997 |
| JP | 2000-298215 | 10/2000 |
| JP | 2005-004560 | 1/2005 |
| WO | 2004/034528 A2 | 4/2004 |

OTHER PUBLICATIONS

Rabus et al., "Optical Filters Based on Ring Resonators with Integrated Semiconductor Optical Amplifiers in GaInAsP-InP", Nov./Dec. 2002, IEEE J. of Selected Topics in Quantum Electronics, vol. 8 No. 6, p. 1405-1411.*

Takahashi et al., "A Stable Widely Tunable Laser Using a Silica-Waveguide Triple-Ring Resonator", 2005, Optical Society of America.*

Liu et al., "Wide Tunable Double Ring Resonator Coupled Lasers", May 2002, IEEE Photonics Technology Letters, vol. 14 No. 5, p. 600-602.*

Yanagase et al., "Box-Like Filter Response and Expansion of FSR by a Vertically Triple Coupled Microring Resonator Filter", Aug. 2002, J. of Lightwave Technology, vol. 20 No. 8, p. 1525-1529.*

Griffel, "Synthesis of Optical Filters Using Ring Resonator Arrays", Jul. 2000, IEEE Photonics Technology Letters, vol. 12 No. 7, p. 810-812.*

Hidayat et al., "Multipath Structure for FSR Expansion in Waveguide-Based Optical Ring Resonator", Feb. 2003, Electronics Letters, vol. 39 No. 4, p. 366-377.*

Rabiei et al., "Tunable Polymer Double Micro-Ring Filters", Sep. 2003, IEEE Photonics Technology Letters, vol. 15 No. 9, p. 1255-1257.*

Rostami et al., "A New Structure for Optical Integrated Digital Filters Using Ring Resonators", 2004, IEEE 10th Asia-Pacific Conference on Communications and 5th International Symposium on Multi-Dimensional Mobile Communication, p. 754-759.*

Yamazaki et al., "A widely tunable laser using silica-waveguid ring resonators", 2005, Proc. of SPIE, vol. 6014.*

Rabus et al., "Resonance Frequency Tuning of a Double Ring Resonator in GaInAsP/InP: Experiment and Simulation", 2002, Jpn. J. Appl. Phys., vol. 41, 1186-1189.*

Yamazaki et al., "Widely Tunable Laser Consisting of a Silica Waveguide Double Ring Resonator Connected Directly to a Semiconductor Optical Amplifier", 2004, ECOC, pp. 22-23.*

Rabus et al., "Box-Like Filter Response of Triple Ring Resonators with Integrated SOA Sections Based on GaInAsP/InP", 2002, IEEE IPRM'02, 479-482.*

Chapman, W B et al. "Temperature tuned external cavity diode laser with micromachined silicone etalons" Conference on Lasers and Electro-optics (CLEO) IEEE Piscataway, NJ, USA, vol. 1, 2004, p. 3 pp. vol. 1, XP002382863.

Lee, C-C et al. "Single-longitudinal-mode fiber laser with a passive multiple-ring cavity and its application for video transmission" Optics Letters, OSA, Optical Society of America, Washington, DC, US, vol. 23, No. 5, Mar. 1, 1998, pp. 358-360, XP000740628.

Liu, B et al. "Wide tunable double ring resonator coupled lasers" IEEE Photonics Technology Letters, IEEE Service Center, Piscataway, NJ, US, vol. 14, No. 5, May 2002, XP011067104.

Rabiei, P et al. "Tunable polymer double micro-ring filters" IEEE Photonics Technology Letters IEEE USA, vol. 15, No. 9, Sep. 2003, pp. 1255-1257, XP002382862.

Rabus, D G et al. "Resonance frequency tuning of a double ring resonator in GAInAsP/InP: experiment and simulation" Japanese Journal of Applied Physics, Tokyo, JP, vol. 41, No. 2B, Feb. 2002, pp. 1186-1189, XP002247220.

Suzuki, K et al. "WDM tuneable dispersion compensator with PLC ring resonators" Optical Fiber Communication Conference, 2004. OFC 2004 Los Angeles, CA, USA, Feb. 23-25, 2004, Piscataway, NJ, USA, IEEE, vol. 1, Feb. 23, 2004, pp. 746-748, XP01044541.

Takahashi, M et al. "A stable widely tunable laser using a silica-waveguide triple-ring resonator" 2005 Optical Fiber Communications Conference Post Deadline Papers (IEEE Cat. No. 05CH37672) IEEE Piscataway, NJ, USA, vol. 5, 2005, p. 3 pp. vol. 5, XP002382864.

Yamazaki, H et al. "A widely tunable laser using silica-waveguide ring resonators" Proceedings of SPIE—the International Society for Optical Engineering; Active and Passive Optical Components for WDM Communications, Boston, MA, USA, Oct. 24-26, 2005, vol. 6014, Oct. 24, 2005, XP002382865.

Yamazaki, H et al. "Widely tunable laser consisting of a silica waveguide double ring resonator connected directly to a semiconductor optical amplifier" Proceedings of the European Conference on Optical Communications (ECOC) 2004, Postdeadline Paper TH4.2. 4, 2004, pp. 22-23, XP009066926.

European Search Report, European Patent Application No. 06004217.3, dated Jul. 27, 2006.

Summons to Attend Oral Proceedings Pursuant to Rule 115(1) EPC, European Patent Application No. 06004217.3, dated Jul. 3, 2009.

Kobayashi, Kohroh; "Optical Integrated Devices"; pp. 104-122; published by Kyoritsu Shuppan Co., Ltd., Dec. 2000.

Madsen, Christi K. et al.; "Optical Filter Design and Analysis"; pp. 272-276; published by Wiley-Interscience, John Wiley & Sons, Inc., New York, N.Y., 1999.

\* cited by examiner $$P_{M1} = \frac{M_2 - 1}{M_1 - 1} \times P_{M2} + N + \phi$$

FIG. 10A $$P_{M1} = \mod\left\{\frac{M_2 - 1}{M_1 - 1} P_{M2}, 1\right\} + N + \phi$$

FIG. 10B $$P_{M1}(\lambda) = \mod\left\{\frac{M_2 - 1}{M_1 - 1} P_{M2}(\lambda), 1\right\} + N_1 + \phi_1$$

$$P_{M2}(\lambda) = \frac{1}{S_{CHANNEL}(M_2 - 1)} (\lambda - W_{CENTER}) + N_2 + \phi_2$$

FIG. 10C

TUNABLE RESONATOR, TUNABLE LIGHT SOURCE USING THE SAME, AND METHOD FOR TUNING WAVELENGTH OF MULTIPLE RESONATOR

CROSS REFERENCE TO RELATED APPLICATIONS

This application claims priority of Japanese Patent Application No. 2005-059645, filed Mar. 3, 2005, and Japanese Patent Application No. 2006-53840, filed Feb. 28, 2006.

BACKGROUND OF THE INVENTION

1. Field of the Invention

The present invention relates to a tunable light source and the like used in a WDM (Wavelength Division Multiplexing) transmission system and the like, for example.

2. Description of the Related Art

Going into an era of broadband, there have been increasing adoptions of WDM transmission systems that are capable of achieving communication with a plurality of light wavelengths by a single system for enabling effective utilization of optical fibers. Recently, there has been widespread use of a DWDM device (Dense Wavelength Division Multiplexing device) which multiplexes some tens of light wavelengths and enables transmission at still higher speed. In accordance with this, each WDM transmission system requires light sources corresponding to each light wavelength, and the required number has been increased dramatically in accordance with high multiplexing. Furthermore, ROADM (Reconfigurable optical add/drop multiplexers) which adds/drops an arbitrary wavelength at each node have lately been investigated for commercial use. With adoption of the ROADM system, in addition to expanding the transmission capacity by multiplexing the wavelengths, it is possible to switch optical paths by changing the wavelengths. Therefore, flexibility of the optical network can be dramatically improved.

As the light source of the WDM transmission system, DFB-LD (Distributed feedback laser diode) which oscillates at uniaxial mode has been used widely so far due to its user-friendliness and high reliability. The DFB-LD has diffraction gratings of about 30 nm depth formed over the entire region of a resonator, so that stable uniaxial mode oscillation can be achieved with a wavelength corresponding to the product of the diffraction grating period and twice the equivalent refractive index. However, the resonant wavelengths over a wide range cannot be tuned in the DFB-LD, so that the WDM system is constituted using products which differ only in terms of the wavelengths for each ITU grid. Since it is necessary to use different products for each wavelength, management cost is increased and surplus stock is required in case of breakdown. Furthermore, when a normal DFB-LD is used in the ROADM system which switches the optical paths by the wavelengths, the tunable width of the wavelength range due to temperature variation is limited to about 3 nm. Therefore, it becomes difficult to achieve the structure of the optical network utilizing the characteristic of the ROADM that actively uses the wavelength resources.

In order to overcome the issues of current DFB-LD and achieve uniaxial mode oscillation in a wide range of wavelengths, there have been actively carried out researches of tunable lasers for tunable light sources. Hereinafter, some of the conventional tunable lasers among those described in detail in the following Non-patent Literature 1 will be presented as an example for describing a conventional tunable laser.

The tunable lasers are classified into two types, i.e. a type where a tuning mechanism is provided within a laser element, and a type where a tuning mechanism is provided outside the laser element.

As the former type, DBR-LD (Distributed Bragg Reflector Laser Diode) has been proposed. The DBR-LD has a structure in which an active region for generating gain and a DBR region for generating reflection by the diffraction grating are formed within a same laser element. The tunable range of the wavelengths of the DBR-LD is about 10 nm at the maximum. Further, there has been proposed a DBR-LD using non-uniform diffraction grating. This DBR-LD has a structure in which an active region for generating the gain and DBR regions sandwiching the active region from the front and rear are formed within a same laser element. In the DBR regions in the front and rear, a large number of reflection peaks are generated by the non-uniform diffraction grating, and the intervals between the reflection peaks are slightly shifted in the front and rear. Due to this structure, so-called "Vernier effect" can be achieved so that it is possible to perform an extremely wide range of tuning. The DBR-LD using the non-uniform diffraction grating achieves tuning action over 100 nm and quasi-continuous tuning action of 40 nm.

The tunable laser of the latter type has a structure that returns light of a specific wavelength to the laser element by rotating a diffraction grating provided outside the laser element.

[Non-patent Literature 1] "Optical Integrated Device" by Kohroh Kobayashi, $2^{nd}$ Impression of $1^{st}$ Edition, KYORITSU SHUPPAN CO., LTD, December 2000, pp. 104-122

[Non-patent Literature 2] "Optical Filter Design and Analysis" by C. K. Madsen, J. H. Zhao However, even though there have been a great number of structures proposed as the conventional tunable lasers, there faces an issue that an unexpected switching of wavelengths called mode jump is likely to be generated. Further, in addition to the fact that it requires complicated wavelength control, there are shortcomings such as low oscillation resistability, high price due to an increase in the number of elements, etc. Therefore, there still remains in the condition that it is difficult to be put in a practical use.

In the DBR-LD, carrier injection is performed to the DBR region for changing the refractive index in the DBR region so as to change the wavelength range. Thus, if crystal defects increase due to the injection of the electric current, the proportion of changes in the refractive index for the current injection fluctuates strikingly. Therefore, it is difficult to maintain the laser oscillation with a constant wavelength. Furthermore, with the current process technique of a compound semiconductor, inch-up of three inches or more is impossible, and there requires a tremendous amount of development cost for achieving it. Thus, the manufacturing cost largely increases with the laser element that is in a structure required to be large-scaled.

In the laser element where the tuning mechanism is provided outside, mode jump is easily generated by the oscillation. Thus, it requires a large-scaled oscillation-resistant mechanism, which results in large-scaled module size and increased price.

SUMMARY OF THE INVENTION

The object of the present invention is to provide a highly reliable, high-performance, and low-cost tunable light source and the like by overcoming the issues of the conventional tunable laser, which are obstacles for putting it to into practical use.

In order to achieve the foregoing object, the tunable resonator according to the present invention comprises: a multiple resonator that oscillates with a wavelength where frequencies of three or more resonant elements with shifted cycles intersect; and a tunable device for controlling a resonant wavelength of the multiple resonator by simultaneously changing respective optical path lengths of the plurality of resonant elements that constitute the multiple resonator.

In the tunable resonator of the present invention, the tunable device simultaneously changes the respective optical path lengths of the plurality of resonant elements constituting the multiple resonator in order to control the resonant wavelength of the multiple resonator that oscillates with a wavelength where frequencies of three or more resonant elements with shifted cycles intersect.

In the case where the multiple resonator has a structure having three resonant elements connected in series, provided that the optical path lengths of the resonant elements are $L_0$, $L_1$, $L_2$ with the shortest optical path length being $L_0$ among the three, and $M_1>1$ and $M_2>1$, Vernier orders $M_1$ and $M_2$ are defined as $$M_1 = \frac{L_1}{L_1 - L_0}, M_2 = \frac{L_2}{L_2 - L_0}$$

so that the following conditions apply.

$$L_1 = \frac{M_1}{M_1 - 1} \times L_0,$$

$$L_2 = \frac{M_2}{M_2 - 1} \times L_0$$

Further, for the phase amount "$P_M$" of changing the optical path length, a change of the optical path length for the length $$\left(\frac{\lambda}{n}\right);$$

where $\lambda$ is the wavelength, n is the refractive index) of the wavelength of the light in the resonant element is defined as one cycle. That is, "$P_M$" is the changed optical path length standardized by one-wavelength of the optical path length. When applying a specific numerical value, for example, the phase amount "$P_M$" at the time when the optical path length changes by $$\frac{2\lambda}{n}$$

is 2.

In the case where the multiple resonator has the structure having three resonant elements connected in series under the definitions described above, provided that respective phase amount "$P_M$" for the two resonant elements whose optical path lengths are to be changed are "$P_{M1}$" and "$P_{M2}$", the tunable devices control the amount of increase and decrease of the phase amounts "$P_{M1}$" and "$P_{M2}$" based on a linear function with a slope of $$\frac{M_2 - 1}{M_1 - 1}.$$

The linear function is desirable to be set as follows.

$$P_{M1} = \frac{M_1 - 1}{M_2 - 1} \times P_{M2} + N + \phi$$

where, N indicates the cycle at which the frequencies of three or more resonant elements with shifted cycles intersect, which is expressed as N=0, 1, ±2, ±3, - - - . Further, $\phi$ indicates the initial phase. In general, $\phi$ can be expressed as $0 \leq \phi < 1$, since $\phi$ satisfying $\phi<0$ or $1 \leq \phi$ is substantially equivalent to $\phi$ satisfying $0 \leq \phi < 1$.

The linear function may be set as follows.

$$P_{M1} = \mod\left\{\frac{M_2 - 1}{M_1 - 1} P_{M2}, 1\right\} + N + \phi \quad (4)$$

The function mod [m, n] is the function indicating the remainder when m is divided by n. The "remainder" herein becomes a numerical value of decimal point or less.

For finding the function mod [m, n], when m=$(M_2-1)/(M_1-1) \times P_{M2}$ and n=1, which means $P_{M1}$=mod [m, n]+N+$\phi$, thus making the following expression.

$$P_{M1} = \mod\left\{\frac{M_2 - 1}{M_1 - 1} P_{M2}, 1\right\} + N + \phi$$

The linear function may be set as follows, provided that the phase amounts of the resonant elements corresponding to resonant wavelength $\lambda$ of the multiple resonator are "$P_{M1}(\lambda)$" and "$P_{M2}(\lambda)$"

$$P_{M1}(\lambda) = \mod\left\{\frac{M_2 - 1}{M_1 - 1} P_{M2}(\lambda), 1\right\} + N_1 + \phi$$

The process of finding the expression is as follows.
Provided that $$m = \frac{M_2 - 1}{M_1 - 1} \left\{ \frac{1}{S_{CHANNEL}(M_2 - 1)} (\lambda - W_{CENTER}) + N_2 + \phi_2 \right\}$$

where, n=1,
"$P_{M1}(\lambda)$" can be expressed as follows.

$$P_{M1}(\lambda) = \mod [m,n] + N_1 + \phi_1$$

Since the function mod [m,n] is a function showing the remainder when m is divided by n, the following equations can be obtained.

$$P_{M1}(\lambda) = \mod\left\{\frac{M_2-1}{M_1-1}P_{M2}(\lambda), 1\right\} + N_1 + \phi$$

$$P_{M2}(\lambda) = \frac{1}{S_{CHANNEL}(M_2-1)}(\lambda - W_{CENTER}) + N_2 + \phi_2$$

Therefore, the relation between "$P_{M1}(\lambda)$" and "$P_{M2}(\lambda)$" can be expressed as in the above-described expression.

Like N described above, $N_1$ and $N_2$ indicate the cycles where the frequencies of the two resonant elements with shifted cycles intersect. $\phi_1$, $\phi_2$ are initial phases, $W_{CENTER}$ is the center of the tunable range of the resonant wavelength $\lambda$, and $S_{CHANNEL}$ is the tunable minimum interval of the resonant wavelength $\lambda$, respectively. The function mod [m, n] is the function indicating the remainder when m is divided by n. Each of the initial phases, i.e. $\phi_1$, $\phi_2$, may be set as the values at which the intensity of the light with the resonant wavelength becomes the maximum. In that case, the light with the stable resonant wavelength can be obtained. Such values of the initial phases may be obtained theoretically by calculation or experimentally by actual measurement. When making this element, the design value and initial phase of actual measurement may become inconsistent due to an influence of manufacture errors. Thus, measurement of the initial phase value is normally carried out after the manufacture. Each of the cycles, i.e. N, $N_1$, $N_2$ may be set as "0". In that case, the phase control amount necessary for obtaining the target property becomes the minimum, so that the energies such as electric power and amount of heat for obtaining the resonant frequency become the minimum. Therefore, the light of the resonant wavelength can be efficiently achieved.

The phase control amount "$P_{M1}(\lambda)$" is permissible within a range of change amount in the phase control necessary for switching to an adjacent resonant wavelength by changing only the phase control amount "$P_{M1}(\lambda)$", centering on a value at which light intensity with the resonant wavelength $\lambda$ becomes maximum; and the phase control amount "$P_{M2}(\lambda)$" is permissible within a range of change amount in the phase control necessary for switching to an adjacent resonant wavelength by changing only the phase control amount "$P_{M2}(\lambda)$", centering on a value at which light intensity with the resonant wavelength $\lambda$ becomes maximum.

The phase control amount "$P_{M1}(\lambda)$" is permissible within 50% of change amount in the phase control necessary for switching to an adjacent resonant wavelength by changing only the phase control amount "$P_{M1}(\lambda)$", centering on a value at which light intensity with the resonant wavelength $\lambda$ becomes maximum; and the phase control amount "$P_{M2}(\lambda)$" is permissible within 50% of change amount in the phase control necessary for switching to an adjacent resonant wavelength by changing only the phase control amount "$P_{M2}(\lambda)$", centering on a value at which light intensity with the resonant wavelength $\lambda$ becomes maximum.

The phase control amount "$P_{M1}(\lambda)$" is permissible within 30% of change amount in the phase control necessary for switching to an adjacent resonant wavelength by changing only the phase control amount "$P_{M1}(\lambda)$", centering on a value at which light intensity with the resonant wavelength $\lambda$ becomes maximum; and the phase control amount "$P_{M2}(\lambda)$" is permissible within 30% of change amount in the phase control necessary for switching to an adjacent resonant wavelength by changing only the phase control amount "$P_{M2}(\lambda)$", centering on a value at which light intensity with the resonant wavelength $\lambda$ becomes maximum.

That is, the phase control amounts $P_{M1}(\lambda)$ and $P_{M2}(\lambda)$ within the above-described range are allowable since the resonance state within that range becomes relatively stable. In order to obtain still more stable resonance state, it is desirable to be within 50% of "the change amount in the phase control necessary for switching to the adjacent resonant wavelength" described above, and more preferable to be within 30% thereof.

It is desirable for the tunable device to be built as a structure that changes the resonant wavelength of the resonant elements in accordance with temperature properties of the resonant elements. In that case, it is desirable for the tunable device to change the optical path lengths by adjusting at least either one of factors out of refractive indexes of the optical paths of the resonant elements or lengths of the optical paths.

The resonant element may be built with a ring resonant element having a ring waveguide. The optical resonant element with the ring waveguide includes both structures, i.e. the structure comprising only the ring waveguide, and the structure comprising each waveguide for input and output in addition to the ring waveguide.

Further, the multiple resonator may be provided with a light reflective function unit. The light reflective function unit has a waveguide structure for reflecting or transmitting light to the multiple resonator. Alternatively, the light reflective function unit is built as a structure that comprises: a reflective function element for reflecting light from the multiple resonator; and a waveguide for letting through the light bidirectionally provided between the multiple resonator and the reflective function element. Furthermore, the multiple resonator and the tunable device may be formed on a same substrate.

The above-described structures are aimed at the tunable resonator, however, the present invention is not limited thereto. The tunable resonator of the present invention may be used for building a tunable light source. The tunable light source according to the present invention is built as a structure that comprises: a multiple resonator that oscillates with a wavelength where frequencies of three or more resonant elements with shifted cycles intersect; a tunable device for controlling a resonant wavelength of the multiple resonator by simultaneously changing respective optical path lengths of the plurality of resonant elements that constitute the multiple resonator; an optical amplifier unit connected to one end of the multiple resonator; and a light reflective function unit present on an opposite side of the end connecting the optical amplifier unit and the multiple resonator.

Further, the optical path length of the resonant element is generally expressed as the refractive index of the optical path×the length. Thus, when constituting the multiple resonator with the resonant elements having a plurality of ring waveguides, the refractive indexes of the optical paths (high refractive crystals) of the resonant elements are adjusted using the tunable device so as to change the optical path lengths of the resonant elements Further, when an etalon filter or Mach-Zehnder interferometer is used as the multiple resonator, for example, the optical path lengths of the resonant elements may be changed by adjusting the length of the optical path, e.g. the length of the optical path formed between each mirror, for example. The resonant elements for constituting the multiple resonator are not limited to those described above, and any types can be used as long as they can be built as the multiple resonator that oscillates with the wavelength where the frequencies of three or more resonant elements of shifted cycles intersect.

For each of the resonant elements constituting the multiple resonator, FSR (free spectral ranges) are slightly different due to the optical path length difference. Thus, the largest light transmission occurs with the wavelength (resonant wavelength) where cyclic changes of light transmissions generated in each resonant element come matched. As described, in the present invention, the multiple resonator is constituted by series-connecting a plurality of resonant elements with slightly different optical path lengths for cleverly utilizing Vernier effect generated thereby.

In the present invention, for changing the resonant wavelength of the multiple resonator by the smallest intervals, it is important to simultaneously change the optical path lengths (phase control amount) for the plurality of resonant elements whose optical path lengths are necessary to be changed. In other words, the resonant wavelength cannot be changed constantly by the smallest interval if the phase control amount is changed only for one of the resonant elements. Specifically, each phase control amount is changed to satisfy the above-described expressions. With this, it is possible to prevent the multiple resonator from being oscillated with an unintended wavelength, thereby allowing a stable tuning action.

With the present invention as described above, the resonant wavelength can be changed by the smallest interval since, in the multiple resonator that oscillates with the wavelength where the frequencies of three or more resonant elements with shifted cycles intersect, the resonant wavelength of the multiple resonator is controlled by simultaneously changing the respective optical path lengths of the plurality of resonant elements constituting the multiple resonator. As a result, switching to an unexpected wavelength can be suppressed, thereby allowing a stable tuning action. With this, it becomes possible to provide a highly reliable, high-performance, and low-price tunable light source.

BRIEF DESCRIPTION OF THE DRAWINGS

FIGS. 10A-10C show equations according to embodiments of the invention.

DETAILED DESCRIPTION OF THE PREFERRED EMBODIMENTS

Embodiments of the present invention will be described hereinafter by referring to the accompanying drawings.

For a tunable light source which comprises a combination of light feedback structure such as etalon filter or a PLC-type ring resonator element (i.e. an external resonator having a plurality of circuit structures) and an optical amplifier such as SOA, there has not yet been established a structure for achieving stable wavelength control without using dynamic wavelength stabilizing mechanism.

The embodiment of the present invention relates to a multiple resonator that is a combination of a plurality of resonant elements having parameters for allowing a stable wavelength control, and to a light generating device comprising the same. In the embodiment of the present invention with the multiple resonator having three or more resonant elements connected in series, Vernier order M is defined such that the relation of $L=M1/(M1-1)L_0$ applies for each optical path length L of the resonant elements other than the optical path length $L_0$ provided that the optical path length of the resonant element with the shortest optical path length is defined as $L_0$. By changing the control amount (described later) for a plurality of the resonant elements simultaneously in accordance with the functions (described later), tuning wavelength of the tunable light source can be stably switched without having a dynamic wavelength stabilizing function.

Figure 1:
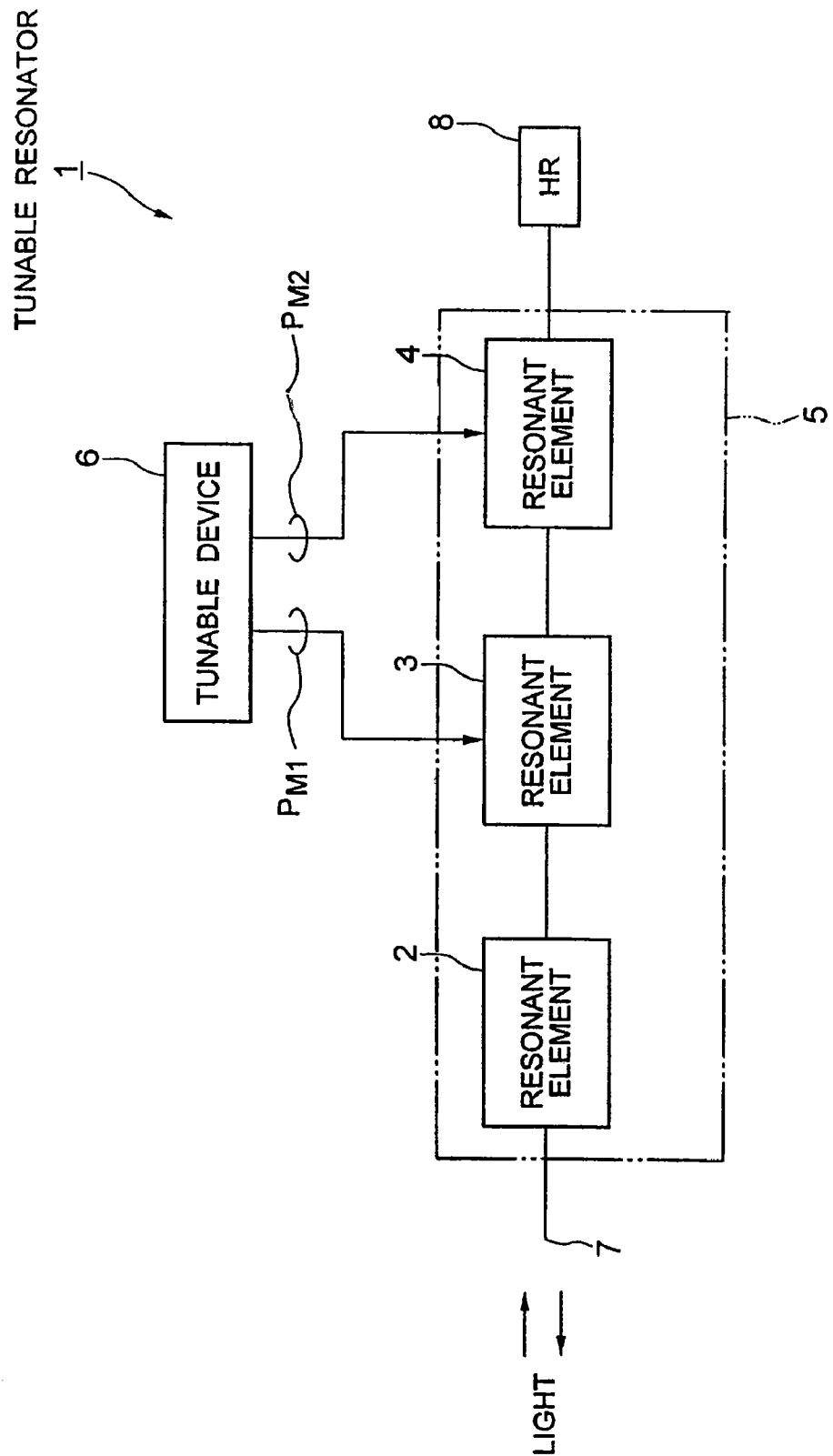
FIG. 1 is a block diagram for showing the basic structure of a tunable resonator according to an embodiment of the present invention.

As shown in FIG. 1, the tunable resonator according to the embodiment of the present invention comprises, as a basic structure, a multiple resonator 5 that resonates with a wavelength where the frequencies of three or more of resonant elements 2, 3, 4 with shifted cycles intersect, and a tunable device 6 for controlling the resonant wavelength of the multiple resonator 5 by simultaneously changing the respective optical paths of the plurality of resonant elements 2, 3, and 4, which constitute the multiple resonator 5.

An optical signal (referred to as light hereinafter) made incident on a light input/output end 7 of the multiple resonator 5 reaches a reflective function element 8 in order from the light input/output end 7, the resonant element 2, the resonant element 3, and the resonant element 4. Then, it is reflected by the reflective function element 8 to be fed back to the light input/output end 7 in order from the resonant element 4, the resonant element 3, and the resonant element 2 and emitted from the light input/output end 7 of the multiple resonator 5. The light emitted from the light input/output end 7 of the multiple resonator 5 at this time oscillates with the resonant wavelength that is determined according to the respective optical path lengths $L_0$-$L_2$ of the resonant elements 2, 3, 4, i.e. the wavelength where the frequencies of the resonant elements 2, 3, 4 with shifted cycles intersect. Thus, the intensity of the light outputted to the light input/output end 7 of multiple resonator 5 becomes the highest.

Therefore, the tunable device 6 can change the resonant wavelength of the multiple resonator 5 by the smallest interval through simultaneously controlling the optical path lengths (phase control amount) of the resonant elements 3, 4.

Further, the optical path length of the resonant element is generally expressed as the refractive index of the optical path×the length. Thus, when constituting the multiple resonator 5 with the resonant elements 2, 3, 4, having a plurality of ring waveguides, the refractive indexes of the optical paths (high refractive crystals) of the resonant elements 2, 3, 4 are adjusted using the tunable device 6 for changing the optical path lengths of the resonant elements 2, 3, 4. Further, when an etalon filter or Mach-Zehnder interferometer is used as the multiple resonator 5, for example, the optical path lengths of the resonant elements 2, 3, 4 are changed by adjusting the lengths of the optical paths, e.g. the length of the optical paths formed between each mirror, for example. The resonant elements for constituting the multiple resonator are not limited to those described above, and any types can be used as long as they can be built as the multiple resonator that oscillates with the wavelength where the frequencies of three or more resonant elements of shifted cycles intersect. The number of the resonant elements for constituting the multiple resonator 5 is not limited to the illustrated number. There is no limit in the number as long as there are three or more of those.

First Embodiment

Next, a first embodiment will be described by referring to FIG. 2, in which resonant elements with ring waveguides (referred to as ring resonant elements hereinafter) 21, 22, 23 are used as the resonant elements 2, 3, 4 for constituting the multiple resonator 5, and the three ring resonant elements 21, 22, 23 are connected in series for building a multiple resonator 20. The multiple resonator 20 corresponds to the multiple resonator 5 of FIG. 1.

The tunable resonator according to the embodiment of the present invention comprises: the multiple resonator 20 which oscillates with the wavelength where the frequencies of the three resonant elements 21, 22, 23 with shifted cycles intersect; and a tunable device (6) which controls the resonant wavelength of the multiple resonator 20 by simultaneously changing the respective optical path wavelengths of the three resonant elements 21, 22, 23. In the embodiment shown in FIG. 2, a TO (Thermo Optic) phase shifter 17 and a controller 18 are used as the tunable device 6 shown in FIG. 1.

The three resonant elements 21, 22, 23 have waveguides for transmitting the light being formed in ring-shapes on a PLC substrate 13 using high-refractive crystals. Further, an input/output-side waveguide 11, reflection-side waveguide 12, and waveguides 24, 25 are formed linearly on the PLC substrate 13. The ring waveguides of the resonant elements 21, 22, 23 and the waveguides 24, 25 are formed on the same substrate, however, they may be formed on separate substrates. Further, the waveguides may be formed on the substrate by quartz-glass-type crystals, lithium niobate, etc.

The resonant element 21, the input/output-side waveguide 11 and the waveguide 24 positioned by sandwiching the element 21 in between, are coupled through an optical coupling device. Further, the resonant element 22 and the waveguides 24, 25 positioned by sandwiching the element 22 in between, are coupled through an optical coupling device. Furthermore, the resonant element 23, the reflection-side waveguide 12 and the waveguide 25 positioned by sandwiching the element 23 in between, are coupled through an optical coupling device. The optical coupling device is of wide use so that the details thereof are omitted, and any types may be used as long as it has a structure for letting through the light bidirectionally without any loss.

An optical signal (referred to as light hereinafter) made incident on the input/output-side waveguide 11 reaches a high reflection film (reflective function element) 14 in the following order: from the input/output-side waveguide 11, to the resonant element 21, to the resonant element 22, and to the resonant element 23, and to the reflection-side waveguide 12. Then, it is reflected by the high reflection film 14 to be fed back to the input/output-side waveguide 11 in the following order: from the reflection-side waveguide 12, to the resonant element 23, to the resonant element 22, to the resonant element 21 and emitted from the input/output-side waveguide 11 to the SOA 15. The light emitted at this time oscillates with the resonant wavelength that is determined according to the respective optical path lengths $L_0$-$L_2$ of the resonant elements 2, 3, 4, i.e. the wavelength where the frequencies of the resonant elements 2, 3, 4 with shifted cycles intersect. Thus, the intensity of the light thereof becomes the highest.

Figure 2:
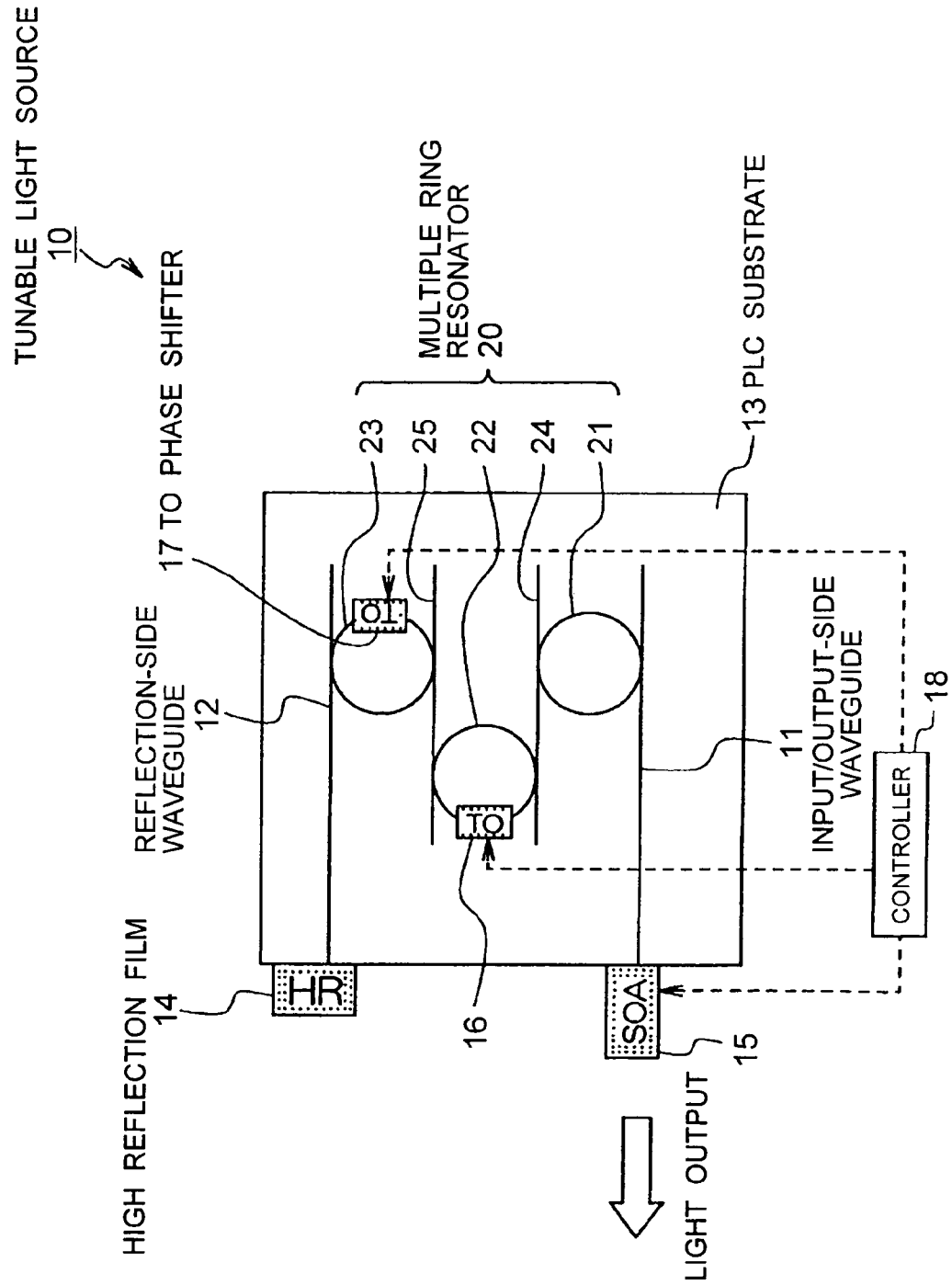
FIG. 2 is a plan view for showing a tunable light source according to the embodiment of the present invention using the tunable resonator shown in FIG. 1.

As shown in FIG. 2, the TO phase shifters 16 and 17 constituting the tunable device are provided on the PLC substrate 13 at the positions corresponding to the ring waveguides of the ring resonant elements 22 and 23. The TO phase shifters 16 and 17 shown in FIG. 2 have a function of changing the optical path lengths $L_1$, $L_2$ of the ring resonant elements 22, 23 by changing the refractive index of the ring waveguides through applying a heat to the ring waveguides of the ring resonant elements 22, 23. In the embodiment shown in FIG. 2, for example, there are used, as the TO phase shifters 16, 17, filmy heaters made of an aluminum thin film, which are deposited on the PLC substrate 13 at the positions of the ring resonant elements 22, 23. The filmy heaters 16 and 17 are heated up by supply of electric power from the controller 18 which will be described later.

In the ring waveguides of the ring resonant elements 22, 23 using glass and a compound semiconductor, the refractive index of the crystal increases in a range of about $1/1000$-$1/100$ due to the temperatures. Thus, when heated by receiving the heat of the filmy heaters 16, 17, the refractive indexes of the ring waveguides of the ring resonant elements 21, 22, 23 are increased, thereby changing the effective optical path lengths $L_0$, $L_1$, $L_2$ of the ring resonant elements 21, 22, 23. By supplying electric power of 0.5 W to the filmy heaters 16, 17 as the TO phase shifters using the controller 18, it is possible to change the optical path lengths of the ring resonant elements 21, 22, 23, which correspond to one-wavelength of the multiple resonator 20.

The embodiment shown in FIG. 2 illustrates the structure in the ideal state where there is no manufacturing error contained in the optical path lengths of the ring waveguides of the ring resonant elements 21, 22, 23. However, practically, there are cases where errors are generated in the optical path lengths when manufacturing the ring waveguides of the ring resonant elements 21, 22, 23. Thus, the TO phase shifters corresponding to the TO phase shifters 16, 17 may be provided to the ring resonant element 21 used for determining the wavelength for allowing fine-tuning of the optical path length $L_0$ of the ring resonant element 21 at the time of starting the tunable resonator. Further, fine-tuning may be performed during the oscillation action for suppressing the shift of each wavelength channel from the wavelength that is used for optical transmission device.

The heat-type TO phase shifters 16, 17 are used as the tunable device for changing or fine-tuning the optical path lengths $L_0$, $L_1$, $L_2$ of the ring resonant elements 21, 22, 23. However, it is not limited to those. There are crystals with a reversible characteristic, which constitute the ring waveguides of the ring resonant elements 21, 22, 23. In such a case, an endothermic mechanism may be used as the TO phase shifters 16, 17, in which an endothermic Peltier element is provided on a substrate and electric power is supplied to the Peltier element by the controller. In the case of the endothermic mechanism, heat is deprived from the ring waveguides of the ring resonant elements 21, 22, 23 for cooling down. Thus, the refractive indexes of the ring waveguides are reduced within a range of $1/1000$-$1/100$. Thereby, the optical path lengths $L_0$, $L_1$, $L_2$ of the ring resonant elements 21, 22, 23 are to be changed. The heat-up type filmy heater or the endothermic Peltier element is used herein as the tunable device.

However, any type can be used as long as it can change the light refractive index of the ring waveguide in any other ways.

The multiple ring resonator 20 is constituted as an optical waveguide type filter in which the ring resonant elements 21-23 having different optical path lengths $L_0$, $L_1$, $L_2$ from each other are connected in series. The multiple ring resonator 20 multiplexes or demultiplexes the optical signals of the resonant wavelength only when all the ring resonant elements 21-23 oscillate simultaneously, and obtains large FSR by Vernier effect. Vernier effect enables an increase in the tunable range by combining a plurality of resonant elements with different optical path lengths, in which each of the resonant frequencies overlap at the frequency of the least common multiple of the frequencies of the plurality of the resonant elements with shifted cycles. Therefore, the FSR functions as if it becomes the frequency of the least common multiple of each ring on the appearance. Thus, it is possible to control the characteristic under wide frequencies much easier than using a single resonant element.

In the above-described embodiment, the multiple resonator 20 is built in a structure in which a plurality of ring resonant elements are combined and input/output of the light is performed through the same waveguide 11. However, the structure is not limited to this. The multiple resonator 20 may be built in such a structure that: the ring resonant elements 21, 22, 23 comprise respective waveguides for input and output provided in the ring waveguides; the optical signal is inputted through one of the waveguides of the multiple resonator 20; and the optical signal whose light intensity is increased in the multiple resonator 20 is outputted from another waveguide of the multiple resonator 20.

As the light reflective function unit provided to the multiple resonator 20, there is used a combination of the high reflection film 14 for reflecting the light from the multiple resonator 20 and the waveguides 11, 12 provided between the multiple resonator 20 and the high reflection film 14 for letting through the light bidirectionally. However, the structure is not limited to this. The light reflective function unit may be formed in a waveguide structure that reflects or transmits the light to the multiple resonator 20. In the case of FIG. 2, the light reflective function unit of the waveguide structure for reflection is built as a structure using no high reflection film 14 but the reflection-side waveguide 12, which inverts the transmission direction of the light from the multiple resonator 20 to be fed back again to the multiple resonator 20. Further, the light reflecting function unit for transmission is applied to the multiple resonator in which input and output of the optical signal is performed through separate waveguides. Thus, it is built as a structure for transmitting the optical signal to the inside the multiple resonator.

Those described above are regarding the structure of the tunable resonator. A tunable light source 10 according to the embodiment of the present invention as shown in FIG. 2 comprises: in addition to the structure of the above-described tunable resonator, an optical amplifier unit 15 connected to one end of the multiple resonator 20; and a reflection unit 14 provided on the opposite side of the connection end of the optical amplifier unit 15 and the multiple resonator 20. In the embodiment shown in FIG. 2, a reflection film 14 with high reflectance is used as the reflection unit 14. The tunable light source 10 corresponds to the above-described light-generating device. Any type can be used as the reflection unit 14 instead of the high reflection film 14 as long as it can reflect the light.

The high reflection film 14 is coupled to the end terminal of the reflection-side waveguide 12 of the tunable resonator and has a function of reflecting the light transmitted from the multiple resonator 20 through the reflection-side waveguide 12 towards the reflection-side waveguide 12. The optical function unit shown in FIG. 2 is constituted with the high reflection film 14 that functions as a reflection element for reflecting the light received from the multiple resonator 20, and the waveguide (reflection-side waveguide 12) provided between the multiple resonator 20 and the reflection element (14) for letting through the light bidirectionally. However, the structure is not limited to this. As shown in FIG. 2B, the optical function unit may be constituted with a waveguide 12b that has two functions, i.e. a function of letting in the light received from the multiple resonator 20 towards the inside and a function of returning it to the multiple resonator 20.

As the optical amplifier unit 15, a semiconductor optical amplifier (SOA) is used. An optical amplifier such as an optical fiber amplifier may be used as the optical amplifier unit 15 and, further, a light source such as a semiconductor laser (laser diode) may also be used.

The controller 18 controls the filmy heaters 16, 17 as the TO phase shifters and the light input/output device 15. Specifically, the controller 18 is constituted with a combination of a microcomputer operated by a program, and a direct-current power supply whose supply of power is controlled by the microcomputer. The microcomputer has functions of: receiving a control signal indicating the resonant wavelength value of the multiple resonator 20 inputted from outside; calculating an electric power value from the control signal and a prescribed expression stored in advance; and supplying the power corresponding to the electric power value to the TO phase shifters 16, 17 from the direct-current power supply. An asymmetrical Mach-Zehnder interferometer for restricting the band may be inserted in the input/output-side waveguide 11 or the reflection-side waveguide 12.

Next, there will be specifically described the case where the resonant wavelength of the multiple resonator is controlled in the embodiment of the present invention.

In the embodiment of the present invention, when controlling the resonant wavelength of the multiple resonator that oscillates with the wavelength where the frequencies of three or more resonant elements with shifted cycles intersect, the respective optical path lengths of the plurality of the resonant elements constituting the multiple resonator are changed simultaneously by the tunable device.

In the case where the multiple resonator has a structure having three resonant elements connected in series, provided that the optical path lengths of the resonant elements are $L_0$, $L_1$, $L_2$ with the shortest optical path length being $L_0$ among the three, and $M_1 > 1$, $M_2 > 1$, Vernier orders $M_1$ and $M_2$ are defined as $$M_1 = \frac{L_1}{L_1 - L_0}, M_2 = \frac{L_2}{L_2 - L_0}$$

so that the following conditions apply.

$$L_1 = \frac{M_1}{M_1 - 1} \times L_0, L_2 = \frac{M_2}{M_2 - 1} \times L_0$$

Further, for the phase amount "$P_M$" of changing the optical path length, when the optical path length changes for the length $$\left(\frac{\lambda}{n};\right.$$

where λ is the wavelength, n is the refractive index) of the wavelength of the light in the resonant element, it is defined as one cycle. When applying a specific numerical value, for example, the phase amount "$P_M$" at the time when the optical path length changes by $$\frac{2\lambda}{n}$$

is 2.

In the case where the multiple resonator has the structure having three resonant elements connected in series under the definitions described above, provided that respective phase amounts "$P_M$" for the two resonant elements whose optical path lengths are to be changed are "$P_{M1}$" and "$P_{M2}$", the tunable devices 16, 17, 18 control the amount of increase and decrease of the phase amounts "$P_{M1}$" and "$P_{M2}$" based on a linear function with a slope of $$\frac{M_2 - 1}{M_1 - 1}.$$

The tunable light source 10 can freely select a prescribed wavelength by the multiple ring resonator 20 and the SOA 15 under the controls of the tunable devices 16, 17 and 18. The optical path length $L_0$ of the ring resonant element 21 as the base is set to be about 4 mm, for example, so that FSR becomes 50 GHz. The optical path lengths $L_1$, $L_2$ of the ring resonant elements 22, 23 can be obtained from expressions (1) and (2) using Vernier orders $M_1$ and $M_2$.

$$L_1 = \frac{M_1}{M_1 - 1} L_0 \quad (1)$$

$$L_2 = \frac{M_2}{M_2 - 1} \quad (2)$$

Like the two-step ring resonator, the three-step ring resonant elements 21-23 structured in this way oscillate lasers with the minimum loss by the wavelength where the respective cycles of the ring resonant elements 21-23 come matched. It is in the structure where the interval of the channels is determined as 50 GHz according to the ring resonant element 21 with the shortest circuit length, and the resonant wavelength can be freely selected by the remaining two ring resonant elements 22, 23.

ASE light outputted from the SOA 15 passes through the three ring resonant elements 21-23. After being reflected by the high reflection film 14, the ASE light returns to the SOA 15 by passing through the three ring resonant elements 21-23 again. The SOA 15 and the PLC substrate 13 are connected through butt coupling, for example. An AR coating is applied on the end face of the SOA 15 on the PLC substrate side, and the fiber-side end face has a reflectance of about 10%. The SOA 15 and the PLC 13 may be connected through directly mounting the SOA 15 on the PLC substrate 13 by passive alignment or through lens-coupling, other than by butt coupling.

The light emitted from the SOA 15 reaches the high reflection film 14 in order from the SOA 15, a non-reflection film, the input/output-side waveguide 11, the multiple resonator 20, reflection-side waveguide 12 and to the high reflection film 14. Then, the light is reflected by the high reflection film 14 and returns to the SOA 15 through the path in order from the reflection-side waveguide 12, the input/output-side waveguide 11, and to the non-reflection film to be reflected by the emission-side end face of the SOA 15. By this light reflecting action, the multiple resonator 20 functions as a laser oscillator. The return light is the light with the resonant wavelength of the multiplex oscillator 20. The reason is as follows. The respective FSR of ring resonant elements 21, 22, 23 constituting the multiple resonator 20 are slightly different, so that there is still larger reflection caused with the wavelength where the cyclic changes of the reflection (transmission) in each of the ring resonant elements 21, 22, 23 come matched. The wavelength where the cycles come matched largely changes due to the changes in the refractive indexes of the waveguides of the respective ring resonant elements 21, 22, 23. Thus, efficient tuning action can be achieved. The waveguide refractive index can be changed by thermooptic effect. The thermooptic effect is a phenomenon where the refractive index of a material increases by heat. In general, any materials have this effect. That is, it is possible to change the resonant wavelength of the multiple resonator 20 by utilizing the temperature properties of the plurality of resonant elements 21, 22, 23. The wavelength can be fluctuated by a refractive-index control method and control of the circumferential length, other than using the thermooptic effect.

Now, there is described an example with a specific numerical value. Provided that the transmission center wavelength of the multiple resonator (light-conductive type filter) 20 is set as 1540 nm and the tunable range of the multiple resonator 20 as 50 nm, the circuit length (that is, $L_0$) of the ring resonant element 21 as the base is about 4 mm. In this state, if the interval of the wavelength channel is 0.4 nm, $M_2$=126 because $M_2$−1 is 50 nm/0.4 nm=125. Further, in that case, $M_1$=12.2 because the condition for maximizing mode gain difference $M_1 - 1 = \sqrt{M_2 - 1}$. Thus, $L_1$ is about 4.36 mm from the expression (1), and $L_2$ is about 4.03 mm from the expression (2).

In this state, the ring resonant element 21 with the shortest ring waveguide $L_0$ operates for fixing ITU grid, the ring resonant element 22 with the longest ring waveguide $L_2$ for fine tuning, and the ring resonant element 23 with the middle-length ring waveguide $L_1$ for rough tuning.

Figure 3:
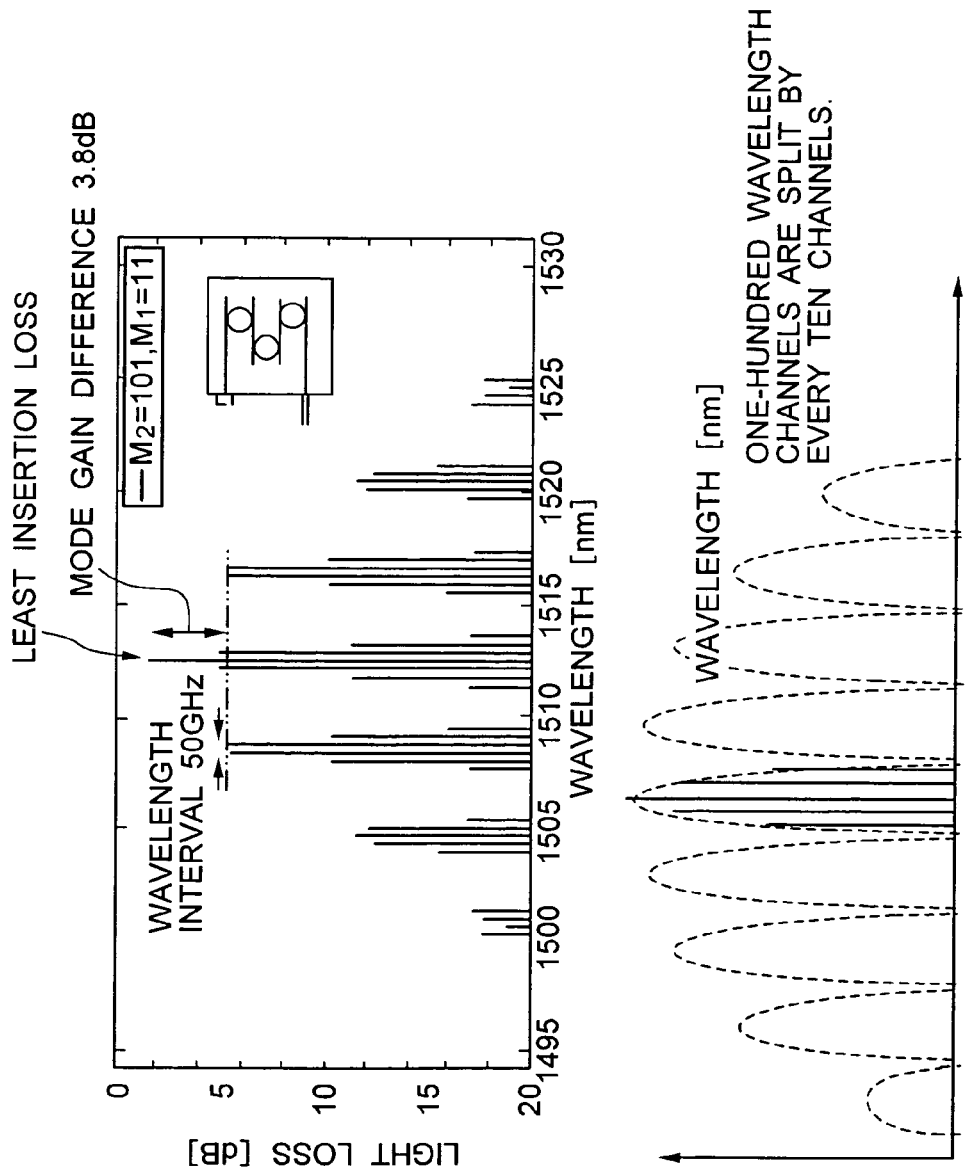
FIG. 3 shows graphs for showing the wavelength response characteristic of the multiple resonator viewed from an SOA side in the tunable light source shown in FIG. 2.

FIG. 3 shows characteristic diagrams showing the wavelength response characteristic of the multiple ring resonator 20 viewed from the SOA 15 side. Description will be provided hereinafter by referring to FIG. 2 and FIG. 3.

In the case shown in FIG. 3, Vernier order is so set that $M_2 - 1 = (M_1 - 1)^2$ applies in addition to the above-described expression (1) and (2). That is, Vernier orders of each of the ring resonant elements are set as $M_1$=11, $M_2$=101. A directional coupler (optical coupling device) operates as a 3-dB coupler by setting as K=π/4. There are one-hundred wavelength channels defined by $M_2$−1 present at 50 GHz intervals, which are grouped by every ten channels defined by $M_1$−1. Specifically, the number of the tunable wavelengths is determined by $M_2$, and one-hundred channels of $M_2$−1 operate. The mode gain difference that is the loss difference between the channel with the least insertion loss and the channel with the second least insertion loss is 3.8 dB.

The group containing the channel with the least insertion loss is called a center group herein, and the groups adjacent to the center group are called as adjacent groups. With this, the following can be said by satisfying the above-described three expressions. That is, in FIG. 3, the insertion losses become almost equivalent between the channel with the second least insertion loss within the center group and the channel with the least insertion loss within the adjacent group.

Figure 4:
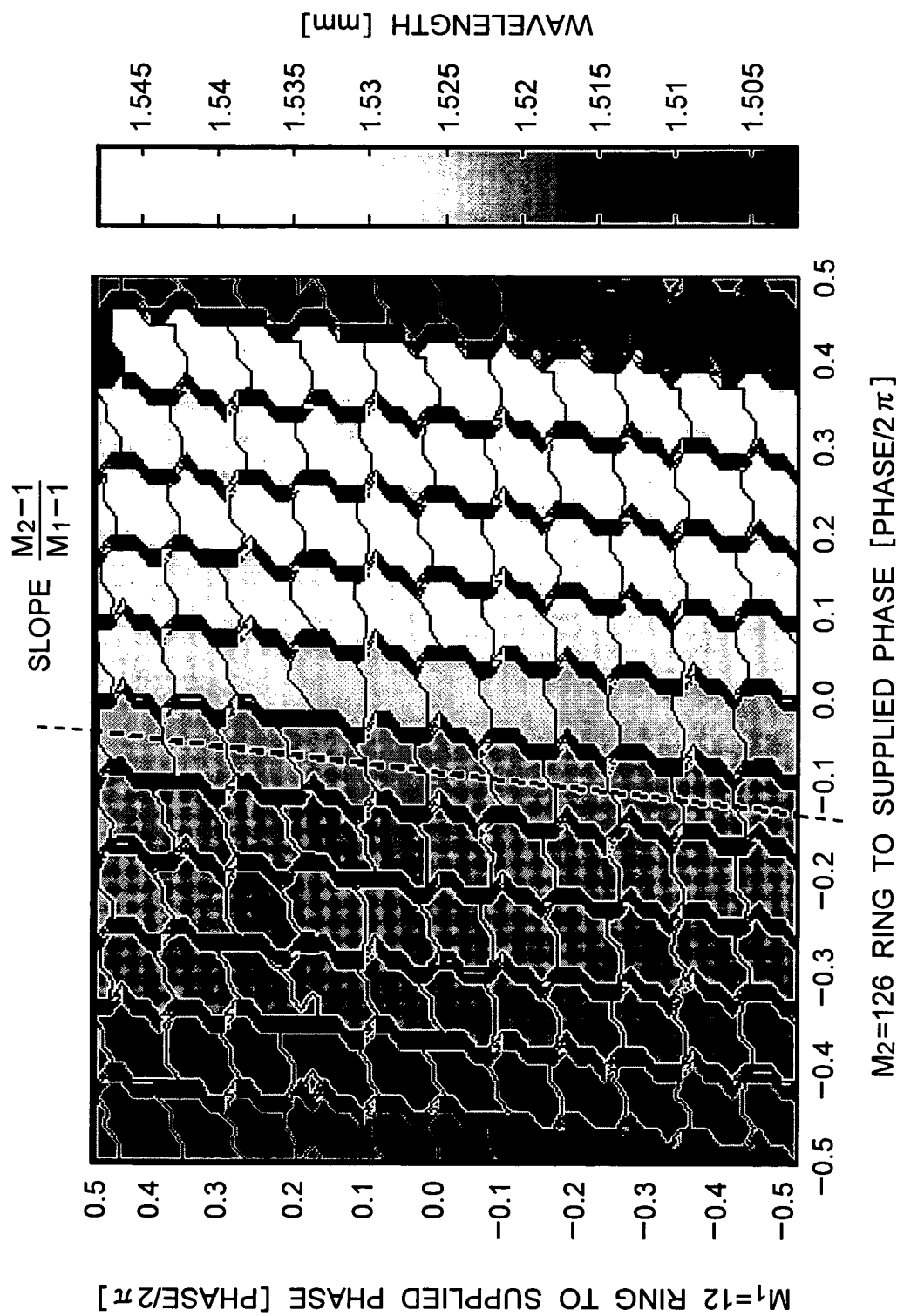
FIG. 4 is a characteristic diagram for showing the relation between the phase control amount and the resonant wavelength for a ring resonator used as the tunable light source shown in FIG. 2.

FIG. 4 is a graph for showing the relation between the phase control amount and the resonant wavelength for the ring resonant elements 22, 23. Action (I) of the tunable light source 10 will be described hereinafter by referring to FIG. 2 and FIG. 4. For the phase control amount, the changed optical path length of the ring resonator is defined as the phase amount that is standardized by the optical path length of the one-wavelength.

FIG. 4 is a result of simulation showing the resonant wavelength in a graph where the horizontal axis the phase control amount for the ring resonant element 23 and the vertical axis is the phase control amount for the ring resonant element 22. Each phase control amount is almost proportional to the power supplied to the TO phase shifters 16 and 17. The Vernier order $M_1$ of the ring resonant element 22 is "12" and the Vernier order $M_2$ of the ring resonant element 23 is "126".

In FIG. 4, the phase control amounts on the vertical axis and horizontal axis are illustrated periodically, which become 1 at $2\pi$. When power of 400 mW, for example, is supplied to the TO phase shifters 16 and 17, the phase of the resonant wavelength can be changed by $2\pi$ (for one-wavelength). Use of the three-step multiple ring resonator 20 having the TO shifters 16, 17 allows selection of a prescribed light-source oscillation wavelength in matrix. Further, when power is supplied to the TO phase shifters 16, 17 for controlling the phase amount by 0.5 (for ½ wavelength) and by –0.5 (for –½ wavelength), the wavelengths characteristics are the same. The ring resonant elements 22 and 23 both have the characteristics of turning at the same wavelength in one cycle. The multiple ring resonator 20 is distinctive in respect that the matrix arrangement of the wavelength is not completely orthogonal but is tilted towards diagonally right in the drawing. It can be seen from this that the supplies of the powers to the TO phase shifters 16 and 17 are not independent but in a mutually relevant relationship.

That is, as can be seen from FIG. 4, it is necessary to change both phase control amounts for the ring resonant elements 22 and 23 simultaneously for changing the resonant wavelength at the smallest intervals constantly. Specifically, both of the phase control amounts for the resonant elements 22 and 23 are simultaneously changed based on a linear function with the slope of $$\frac{M_2 - 1}{M_1 - 1}.$$

Specifically, each phase control amount is changed such that one of following expressions (3), (4), (5) and (6) is satisfied. With this, oscillation with an undesired wavelength can be prevented, thereby allowing a stable tuning action.

The resonant wavelength of the multiple resonator is controlled through simultaneously changing the respective optical path lengths of the ring resonant elements 22 and 23 by utilizing the temperature properties of the TO phase shifters 16 and 17. Provided that the optical path lengths of the resonant elements 21, 22, 23 are $L_0$, $L_1$, $L_2$, Vernier orders are $M_1 > 1$, $M_2 > 1$, the optical path lengths are defined as $$L_1 = \frac{M_1}{M_1 - 1} L_0$$

$$L_2 = \frac{M_2}{M_2 - 1} L_0,$$

the phase amount is the changed optical path length standardized by one-wavelength of the optical path length, and the respective phase amounts of the two ring resonant elements 22, 23 whose optical path lengths are to be changed are defined as "$P_{M1}$" and "$P_{M2}$", the tunable devices (16, 17, 18) control the increase/decrease amount of the phase amounts "$P_{M1}$" and "$P_{M2}$"

$$\frac{M_2 - 1}{M_1 - 1}.$$

based on a linear function with the slope of Provided that the phase amounts for the resonant elements 22, 23 are defined as "$P_{M1}$" and "$P_{M2}$", respectively, the linear function is set as the following expression (3).

$$P_{M1} = \frac{M_1 - 1}{M_2 - 1} \times P_{M2} + N + \phi \qquad (3)$$

In this expression, N indicates the cycle at which the frequencies of three or more resonant elements with shifted cycles intersect, which is expressed as N=0, ±1, ±2, ±3, - - - . Further, $\phi$ indicates the initial phase. In general, $\phi$ can be expressed as $0 \leq \phi < 1$, since $\phi$ satisfying $\phi < 0$ or $1 \leq \phi$ is substantially equivalent to $\phi$ satisfying $0 \leq \phi \leq 1$.

As described, a linear expression applies to the relation between the two phase control amounts "$P_{M1}$" and "$P_{M2}$". The oscillation wavelength of the tunable light source 10 has such periodicity and mutual relationship since it is determined from the least common multiple of the FSR as the cycles of the three ring resonant elements 21-23.

Further, the linear function may be set as the following expression (4).

$$P_{M1} = \text{mod}\left\{\frac{M_2 - 1}{M_1 - 1} P_{M2}, 1\right\} + N + \phi \qquad (4)$$

The function mod [m, n] is the function indicating the remainder when m is divided by n. The "remainder" herein becomes a numerical value of a decimal point or less.

For finding the function mod [m, n], when m=$(M_2-1)/(M_1-1) \times P_{M2}$, and n=1, which means $P_{M1}$=mod [m, n]+N+$\phi$, thus making the following expression.

$$P_{M1} = \text{mod}\left\{\frac{M_2 - 1}{M_1 - 1} P_{M2}, 1\right\} + N + \phi$$

where, N and $\phi$ correspond to those described above.

The linear function may be set as follows, provided that the phase amounts of the resonant elements corresponding to resonant wavelength λ of the multiple resonator are "$P_{M1}(\lambda)$" and "$P_{M2}(\lambda)$".

$$P_{M1}(\lambda) = \text{mod}\left\{\frac{M_2-1}{M_1-1}P_{M2}(\lambda), 1\right\} + N_1 + \phi \tag{5}$$

The process of finding the expression is as follows. Provided that $$m = \frac{M_2-1}{M_1-1}\left\{\frac{1}{S_{CHANNEL}(M_2-1)}(\lambda - W_{CENTER}) + N_2 + \phi\right\}$$

where, n=1, "$P_{M1}(\lambda)$" can be expressed as follows.

$$\text{Phase}_{M1}(\lambda) = \text{mod}\,[m,n] + N_1 + \phi_1$$

Since the function mod [m,n] is a function showing the remainder when m is divided by n, the following equations can be obtained.

$$P_{M1}(\lambda) = \text{mod}\left\{\frac{M_2-1}{M_1-1}P_{M2}(\lambda), 1\right\} + N_1 + \phi \tag{6}$$

$$P_{M2}(\lambda) = \frac{1}{S_{CHANEL}(M_2-1)}(\lambda - W_{CENTER}) + N_2 + \phi_2$$

Therefore, the relation between "$P_{M1}(\lambda)$" and "$P_{M2}(\lambda)$" can be expressed as in the above-described expression.

Like the above-described N, $N_1$ and $N_2$ indicate the cycles where the frequencies of the two resonant elements with shifted cycles intersect. $\phi_1$, $\phi_2$ are initial phases, $W_{CENTER}$ is the center of the tunable range of the resonant wavelength λ of the multiple resonator 20, and $S_{CHANNEL}$ is the tunable minimum interval of the resonant wavelength λ of the multiple resonator 20, respectively. The function mod [m, n] is the function indicating the remainder when m is divided by n. Each of the initial phases, i.e. $\phi_1$, $\phi_2$, may be set as the values at which the intensity of the light with the resonant wavelength becomes the maximum. In that case, the light with the stable resonant wavelength can be obtained. Such values of the initial phases may be obtained theoretically by calculation or experimentally by actual measurement. Each of the cycles, i.e. N, $N_1$, $N_2$ may be set as "0". In that case, the energy necessary for obtaining each phase control amount becomes the minimum, so that the light with the resonant wavelength can be efficiently achieved.

The phase control amount "$P_{M1}(\lambda)$" is permissible within a range of change amount in the phase control amount necessary for switching to an adjacent resonant wavelength by changing only the phase control amount "$P_{M1}(\lambda)$", centering on a value at which light intensity with the resonant wavelength λ becomes maximum; and the phase control amount "$P_{M2}(\lambda)$" is permissible within a range of change amount in the phase control necessary for switching to an adjacent resonant wavelength by changing only the phase control amount "$P_{M2}(\lambda)$", centering on a value at which light intensity with the resonant wavelength λ becomes maximum.

The phase control amount "$P_{M1}(\lambda)$" is permissible within 50% of change amount in the phase control amount necessary for switching to an adjacent resonant wavelength by changing only the phase control amount "$P_{M1}(\lambda)$", centering on a value at which light intensity with the resonant wavelength λ becomes maximum; and the phase control amount "$P_{M2}(\lambda)$" is permissible within 50% of change amount in the phase control necessary for switching to an adjacent resonant wavelength by changing only the phase control amount "$P_{M2}(\lambda)$", centering on a value at which light intensity with the resonant wavelength λ becomes maximum.

The phase control amount "$P_{M1}(\lambda)$" is permissible within 30% of change amount in the phase control necessary for switching to an adjacent resonant wavelength by changing only the phase control amount "$P_{M1}(\lambda)$", centering on a value at which light intensity with the resonant wavelength λ becomes maximum; and the phase control amount "$P_{M2}(\lambda)$" is permissible within 30% of change amount in the phase control necessary for switching to an adjacent resonant wavelength by changing only the phase control amount "$P_{M2}(\lambda)$", centering on a value at which light intensity with the resonant wavelength λ becomes maximum.

That is, the phase control amounts $P_{M1}(\lambda)$ and $P_{M2}(\lambda)$ within the above-described range are allowable since the resonance state within that range becomes relatively stable. In order to obtain still more stable resonance state, it is desirable to be within 50% of "the change amount in the phase control necessary for switching to the adjacent resonant wavelength" described above, and more preferable to be within 30% thereof.

Figure 5:
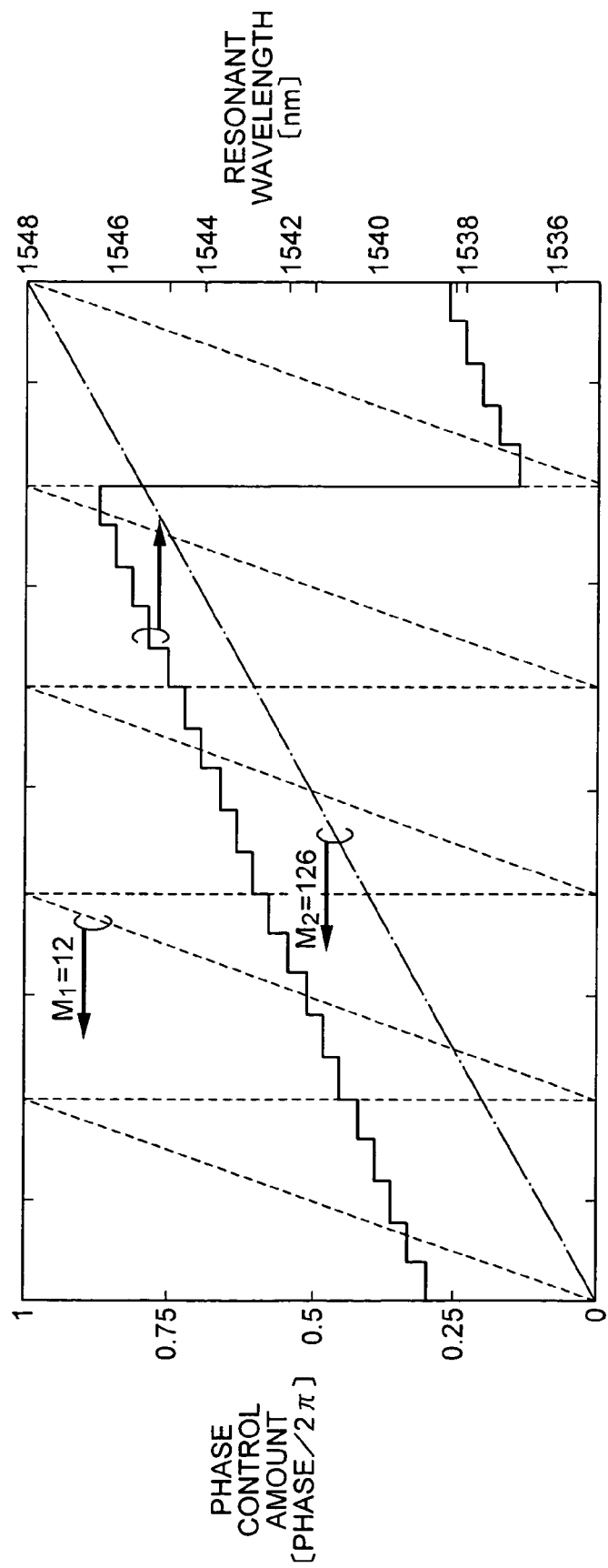
FIG. 5 is a characteristic diagram for showing the resonant wavelength when the phase control amount for the ring resonator used as the tunable light source shown in FIG. 2 is varied.

FIG. 5 is a characteristic diagram for showing the resonant wavelength when the phase control amounts for the ring resonant elements 22, 23 are changed to satisfy a prescribed expression. Action of the tunable light source 10 will be described hereinafter by referring to FIG. 2 and FIG. 5.

FIG. 5 shows an example of the resonant wavelength in the case where the phase control amounts for the ring resonant elements 22, 23 are changed to satisfy one of the above-described expressions (3), (4), (5), and (6). In this example, Vernier order $M_1$ of the ring resonant element 22 is "12" and Vernier order $M_2$ of the ring resonant element 23 is "126". In FIG. 5, the powers supplied to the phase shifters 16 and 17, i.e. the phase control amounts, are shown by a broken line and an alternate long and short dash line, respectively, and the oscillation wavelength of the tunable light source at that time, i.e. the resonant wavelength, is shown by a solid line. In this way, by controlling the optical path lengths (phases) of the ring resonant elements 22, 23 in accordance with the above-described expressions, it is possible to change the wavelength discretely.

Each of the initial phases, i.e. $\phi$, $\phi_1$, $\phi_2$, in the expressions (3), (4), (5) and (6) are set as the values at which the intensity of the light with the resonant wavelength of the multiple resonator 20 becomes the maximum. Further, each of the cycles, i.e. N, $N_1$, $N_2$, are set as "0".

Figure 6:
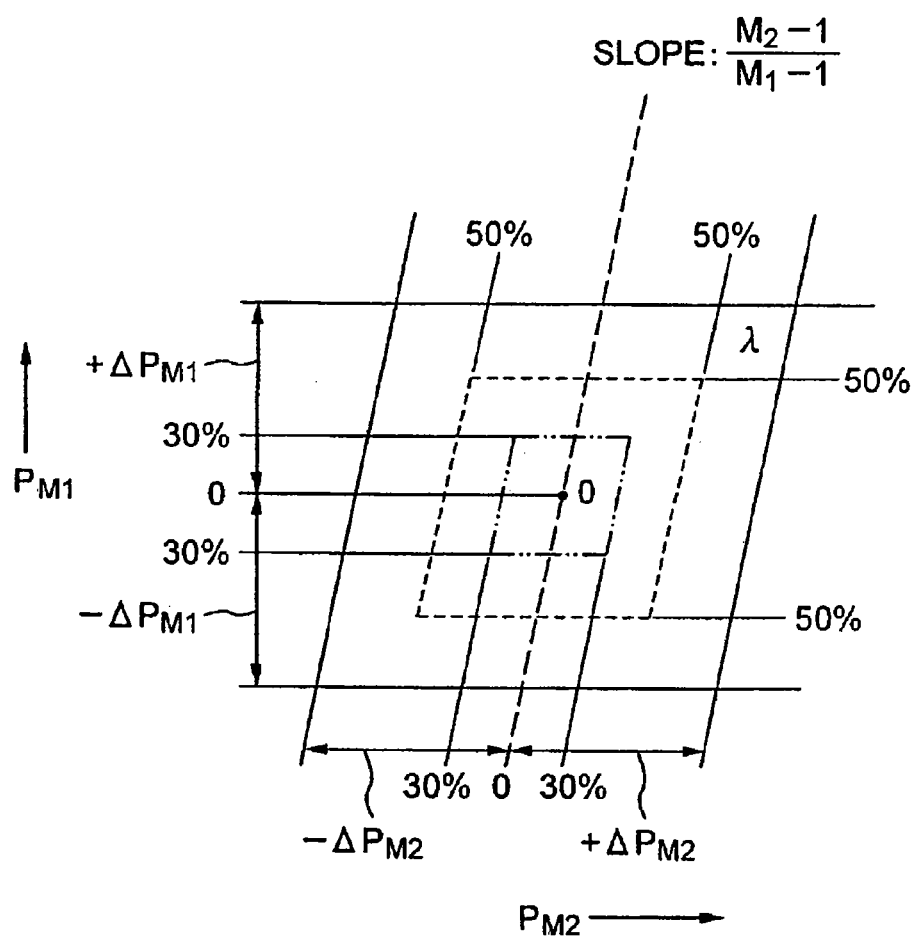
FIG. 6 is a characteristic diagram for showing the relation between the phase control amount and the resonant wavelength for describing the permissible value of the phase control amount in the tunable light source showing in FIG. 2.
Figure 7:
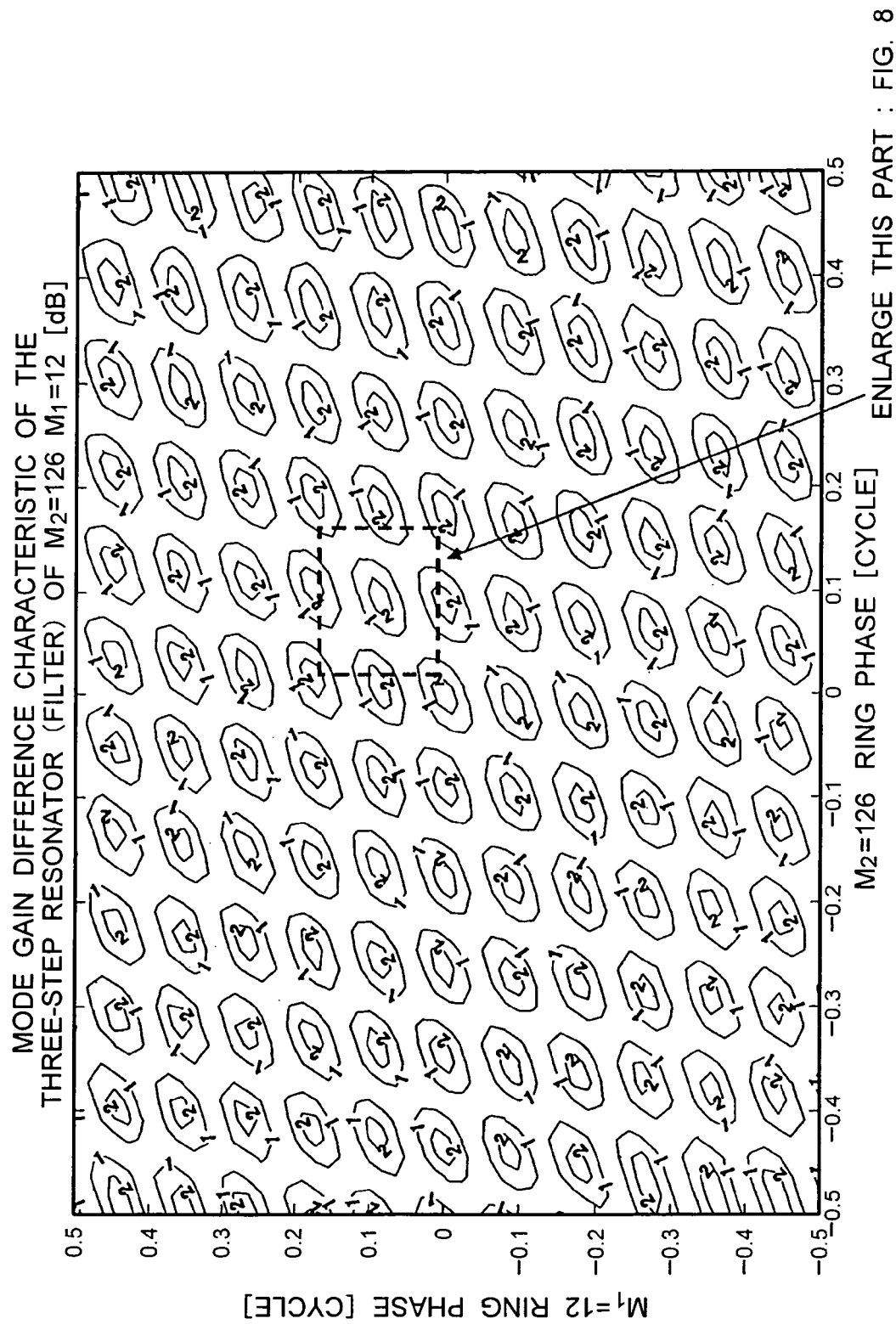
FIG. 7 is a characteristic diagram for showing the relation between the phase control amount and the mode gain difference for describing the permissible value of the phase control amount in the tunable light source showing in FIG. 2.
Figure 8:
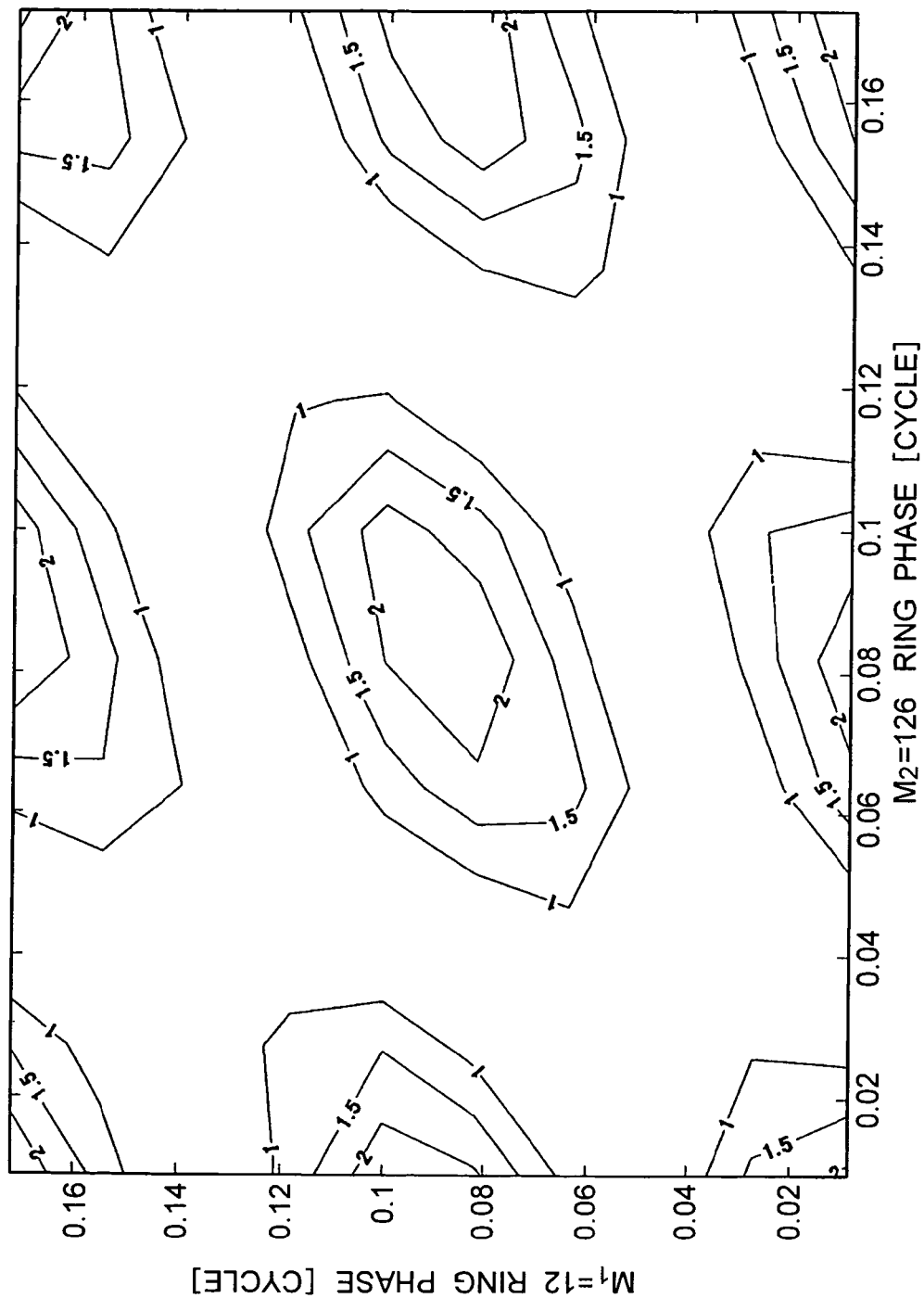
FIG. 8 is a fragmentary enlarged view of FIG. 7.

FIG. 6 is an illustration showing the relation between the phase control amounts $P_{M1}$, $P_{M2}$ and the resonant wavelength λ for describing the permissible range of the phase control amounts $P_{M1}$, $P_{M2}$ for the ring resonant elements 22 and 23. FIG. 7 is a characteristic diagram for showing the relation between the phase control amounts for the ring resonant elements 22, 23 and the mode gain difference. FIG. 8 is a fragmentary enlarged view of FIG. 7. There will be provided a description hereinafter by referring to FIG. 4, FIG. 6 and FIG. 8.

FIG. 6 is a fragmentary schematic view of FIG. 4, which shows the resonant wavelength λ where the horizontal axis is the phase control amount $P_{M1}$ for the ring resonant element 23 and the vertical axis is the phase control amount $P_{M2}$ for the ring resonant element 22. In the following, the permissible ranges of the phase control amounts $P_{M1}$, $P_{M2}$ for maintaining the resonant wavelength λ of the multiple resonator 20 will be described.

It is permissible for the phase control amount $P_{M1}$ to be within a range of $\pm\Delta P_{M1}$ of the change amount of the phase control which is necessary for switching to the adjacent resonant wavelength by changing only the phase control amount $P_{M1}$, centering on the value O at which the light intensity of the resonant wavelength becomes the maximum. Similarly, it is permissible for the phase control amount $P_{M2}$ to be within a range Of $\pm\Delta P_{M2}$ of the change amount of the phase control which is necessary for switching to the adjacent resonant wavelength by changing only the phase control amount $P_{M2}$, centering on the value O at which the light intensity of the resonant wavelength becomes the maximum. In other words, it is permissible as long as the value is within the solid-line parallelogram in case of FIG. 6.

To have the maximum light intensity of the resonant wavelength λ also means to have the maximum mode gain difference. Thus, as the phase control amounts $P_{M1}$, $P_{M2}$ deviate from the center O, there increases a risk of being arbitrarily switched to the adjacent resonant wavelength due to noise and the like. Therefore, in order to obtain more stable resonance state, it is preferable to be within 50% of "$\pm\Delta P_{M1}$ or $+\Delta P_{M2}$ of the change amount of the phase control necessary for switching to the adjacent resonant wavelength", respectively, and more preferable to be within 30% thereof. In other words, it is permissible as long as the value is within the frame of a broken-line or the frame of an alternate long and two dash line of the parallelogram. Next, the grounds for determining as "50%" and "30%" will be described.

For example, there are often found the wavelength dependency in the gain characteristic of the SOA 15. There is no wavelength dependency in an idealistic SOA, however, the wavelength dependency is generated due to the matter of material and manufacturing method. As an example, there is described an issue of SOA end-face reflection, which is most likely to happen.

In the idealistic SOA, the light inputted from outside passes through the inside of the SOA in one direction, which is emitted outside naturally. Thus, a non-reflective coating is applied on the SOA end face so that the reflectance at the end face becomes "0" ideally. However, practically, it is not possible to shut the reflectance completely. Thus, resonant mode is generated inside the SOA. Because of this resonant mode, periodical ripples determined by the cavity length (optical path length) of the SOA are contained in the gain component of the amplifier.

The substantial gain characteristic of the three-step resonant laser (multiple resonator) is determined by multiplying the gain characteristic of the resonant elements connected in series in three steps and the gain characteristic of the amplifier (SOA). Thus, the wavelength channel for laser-oscillation of the multiple resonator is changed from a desired wavelength by receiving an influence of the SOA gain characteristic. Therefore, it is necessary to operate lasers under a condition where it is possible to maintain the largest gain difference possible. There may be cases where the ripple amount of such SOA reaches about 2 dB, so that the mode gain difference of the multiple resonator with three-step ring resonant elements needs to be set as 2 dB or more.

According to the simulation, the maximum mode gain difference is achieved in the center area of the oscillation wavelength of the multiple resonator 20 in FIG. 6. In FIG. 7, there are plotted the mode gain differences in the phases (optical path length) of each ring waveguide of the ring resonant elements 22, 23 included in the multiple resonator 20.

The mode gain difference becomes the maximum under a condition where the resonant wavelength of the multiple resonator 20 becomes the most stable, which is the condition of the center in FIG. 6. FIG. 7 shows a fragmentary view showing a condition of the mode gain difference in one wavelength channel. As can be seen from the drawing, the condition for obtaining the mode gain difference of 1 dB or more is to be the width within ±50% of the phase difference at which the maximum mode gain difference part is switched to the adjacent wavelength. The condition for obtaining the mode gain difference of 2 dB or more is to be the width within ±30% of the phase difference. That is, it is necessary to be operated under the condition where the mode gain difference exceeding the ripple characteristic of the SOA used for laser can be obtained. The wavelength ripple characteristic of a regular SOA is about 2 dB, and those with fine characteristic have that of about 1 dB.

Second Embodiment

Figure 9:
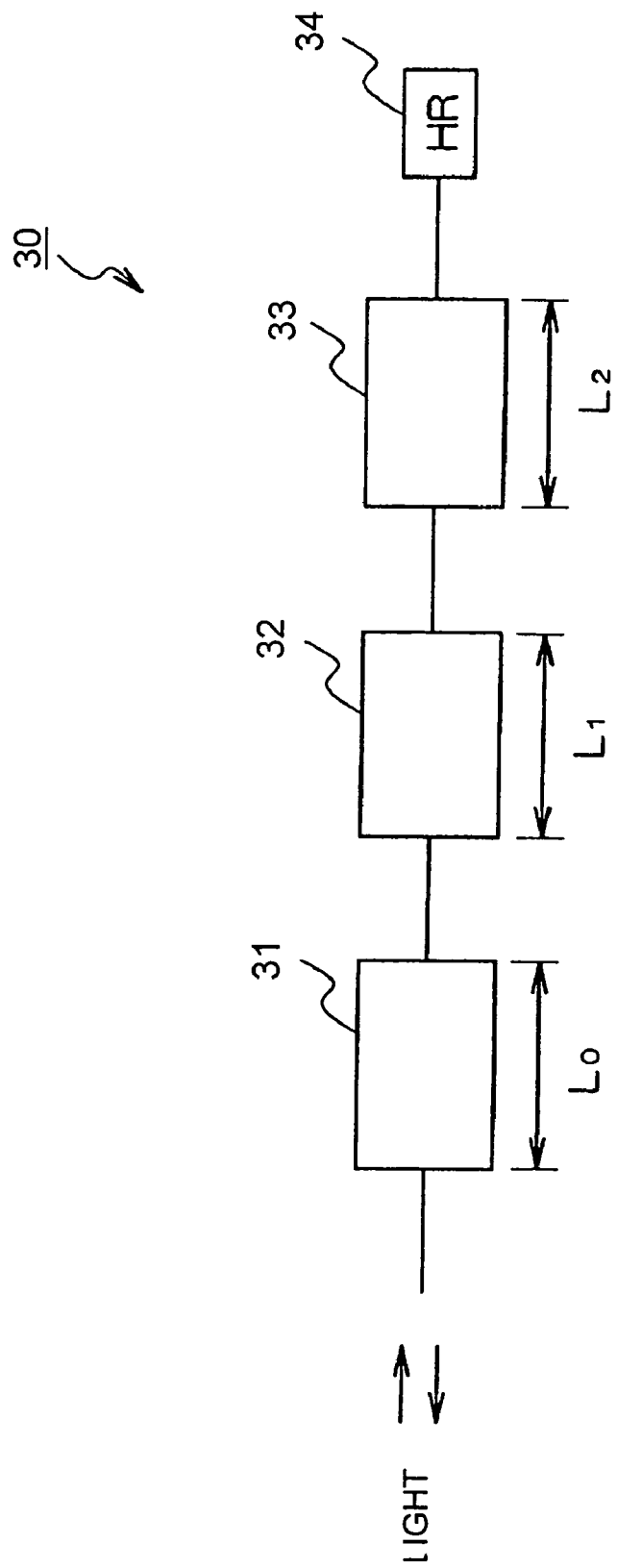
FIG. 9 is a schematic diagram for showing a tunable light source according to another embodiment of the present invention.

FIG. 9 is a schematic diagram for showing another tunable light source according to a second embodiment of the present invention. Description will be provided hereinafter by referring to the drawing.

In the embodiment shown in FIG. 2, the ring resonant elements 21, 22, 23 having ring waveguides are used as the multiple resonator 20. Meanwhile, in the embodiment shown in FIG. 9, etalon filters 31-33 are used instead of the ring resonant elements, which are connected in series for constituting a multiple resonator 30.

The etalon filters 31, 32, 33 constituting the multiple resonator 30 are set to have different optical path lengths from each other. In the embodiment shown in FIG. 9, the optical path lengths of the etalon filters 31, 32, 33 are changed through modifying the lengths of the optical paths of the etalon filters 31, 32, 33.

The light emitted from an SOA (not shown), for example, reaches the high reflection film 34 in order from the etalon filter 31, the etalon filter 32, and the etalon filter 33. The light is reflected by the high reflection film 34 and returned to the SOA through the optical path in order from the etalon filter 33, the etalon filter 32, and the etalon filter 32. The light retuned to the SOA oscillates with the resonant wavelength that is determined by the optical path lengths $L_0$, $L_1$, $L_2$ of the etalon filters 31, 32, 33, i.e. the wavelength where the frequencies of the etalon filters (resonant elements) 31, 32, 33 with shifted cycles intersect, so that the intensity of the light emitted from the multiple resonator 30 becomes the highest.

Like the embodiment shown in FIG. 2, the embodiment shown in FIG. 9 can achieve the same operations and effects as those of the first embodiment by changing the optical path lengths of the etalon filters 31, 32, 33 in accordance with the expressions (3), (4), (5) and (6).

Instead of the etalon filter, for example, a high refractive crystal such as Mach-Zehnder interferometer may be used. A tunable device of the high refractive crystal is a mechanism that tilts the polarized wave of the light making incident on the birefringence crystal, for example. The tunable device of the Mach-Zehnder interferometer is a TO phase shifter similar to those of the first embodiment, for example.

As the resonant elements constituting the multiple resonator, any types may be used instead of the ring resonant elements as long as those are capable of functioning as the resonant elements, e.g. etalon filters, Mach-Zehnder interferometers, high refractive crystals. The FSR (free spectral ranges) of the resonant elements constituting the multiple resonator are slightly different due to the difference in the optical path lengths. Thus, the largest light transmission occurs with the wavelength (resonant wavelength) where the periodic changes of the light transmission generated in each resonant element come matched. As described, the embodiment of the present invention constitutes the multiple resonator by connecting a plurality of resonant elements with slightly different optical path lengths in series, which allows use of Vernier effect in an effective way.

Needless to say, the present invention is not limited to the first and second embodiments described above. For example, the multiple resonator may be constituted with four or more resonant elements.

As described above, in the multiple resonator according to the present invention, which oscillates with the wavelength where the frequencies of three or more resonant elements with shifted cycles intersect, the respective optical path lengths of the plurality of resonant elements constituting the multiple resonator are changed simultaneously for controlling the resonant wavelength of the multiple resonator. Thus, it is possible to change the resonant wavelength by the smallest interval.

What is claimed is:

1. A tuning method for controlling a resonant wavelength of a multiple resonator, the method comprising:
 providing a multiple resonator comprising three or more resonant elements connected in series, wherein a first resonant element has a shorter optical path length than the other resonant elements, and wherein the remaining resonant elements other than the first resonant element have a tunable device associated therewith; and
 simultaneously changing respective optical path lengths of each of the three or more resonant elements using the tunable devices, such that the multiple resonator resonates at a wavelength where frequencies of the three or more resonant elements with shifted cycles intersect,
 wherein the optical path lengths of the resonant elements are $L_0$, $L_1$, $L_2$ and $M_1 > 1$ and $M_2 > 1$, the optical path lengths are defined as $$L_1 = \frac{M_1}{M_1 - 1} L_0,$$

$$L_2 = \frac{M_2}{M_2 - 1} L_0,$$

phase amount "$P_M$" is the changed optical path length standardized by one-wavelength of the optical path length, and the respective phase amount "$P_M$" of the plurality of resonant elements whose optical path lengths are to be changed are defined as "$P_{M1}$" and "$P_{M2}$", and the tunable device controls the increase/decrease amount of the phase amount "$P_{M1}$" and "$P_{M2}$" based on a function with a slope of $$\frac{M_2 - 1}{M_1 - 1}.$$

2. The tuning method of claim 1, wherein the tunable devices comprise thermo-optic phase shifters.

3. The tuning method of claim 1, wherein the function is $$P_{M1} = \frac{M_1 - 1}{M_2 - 1} \times P_{M2} + N + \phi,$$

where N is a cycle where frequencies of the three or more resonant elements with shifted cycles intersect and $\phi$ is the initial phase.

4. A tuning method for controlling a resonant wavelength of a multiple resonator the method comprising:
 providing a multiple resonator comprising three or more resonant elements connected in series, wherein a first resonant element has a shorter optical path length than the other resonant elements, and wherein the remaining resonant elements other than the first resonant element have a tunable device associated therewith; and
 simultaneously changing respective optical path lengths of each of the three or more resonant elements using the tunable devices, such that the multiple resonator resonates at a wavelength where frequencies of the three or more resonant elements with shifted cycles intersect,
 wherein the optical path lengths of the resonant elements are $L_0$, $L_1$, $L_2$, and $M_1 > 1$ and $M_2 > 1$, the optical path lengths are defined as $$L_1 = \frac{M_1}{M_1 - 1} L_0, \; L_2 = \frac{M_2}{M_2 - 1} L_0,$$

phase amount "$P_M$" is the changed optical path length standardized by one-wavelength of the optical path length, and the respective phase amount "$P_M$" of the three resonant elements whose optical path lengths are to be changed are defined as "$P_{M1}$" and "$P_{M2}$", and the tunable device controls the increase/decrease amount of the phase amount "$P_{M1}$" and "$P_{M2}$" based on a function wherein $$P_{M1} = \mathrm{mod}\left\{\frac{M_2 - 1}{M_1 - 1} P_{M2}, 1\right\} + N + \phi,$$

where N is a cycle where frequencies of the three or more resonant elements with shifted cycles intersect and $\phi$ is the initial phase.

5. The tuning method of claim 4, wherein, provided that the phase amounts of the resonant elements corresponding to resonant wavelength $\lambda$ of the multiple resonator are "$P_{M1}$" and "$P_{M2}$", the functions for the phase control amounts $P_{M1}(\lambda)$ and $P_{M2}(\lambda)$ are $$P_{M1}(\lambda) = \mathrm{mod}\left\{\frac{M_2 - 1}{M_1 - 1} P_{M2}(\lambda), 1\right\} + N_1 + \phi_1 \text{ and}$$

$$P_{M2}(\lambda) = \frac{1}{S_{CHANNEL}(M_2 - 1)}(\lambda - W_{CENTER}) + N_2 + \phi_2;$$

where N is a cycle where frequencies of the three or more resonant elements with shifted cycles intersect, $\phi$ is the initial phase, $W_{CENTER}$ is the center of the tunable range of the resonant wavelength $\lambda$ of the multiple resonator, and $S_{CHANNEL}$ is the tunable minimum interval of the resonant wavelength $\lambda$ of the multiple resonator.

6. The tuning method of claim 5, wherein:
 the phase control amount "$P_{M1}(\lambda)$" is permissible within a range of change amount in the phase control necessary for switching to an adjacent resonant wavelength by changing only the phase control amount "$P_{M1}(\lambda)$", centering on a value at which light intensity with the resonant wavelength $\lambda$ becomes maximum; and the phase control amount "$P_{M2}(\lambda)$" is permissible within a range of change amount in the phase control necessary for switching to an adjacent resonant wavelength by changing only the phase control amount "$P_{M2}(\lambda)$", centering on a value at which light intensity with the resonant wavelength $\lambda$ becomes maximum.

7. The tuning method of claim 5, wherein:

the phase control amount "$P_{M1}(\lambda)$" is permissible within 50% of change amount in the phase control necessary for switching to an adjacent resonant wavelength by changing only the phase control amount "$P_{M1}(\lambda)$", centering on a value at which light intensity with the resonant wavelength $\lambda$ becomes maximum; and the phase control amount "$P_{M2}(\lambda)$" is permissible within 50% of change amount in the phase control necessary for switching to an adjacent resonant wavelength by changing only the phase control amount "$P_{M2}(\lambda)$", centering on a value at which light intensity with the resonant wavelength $\lambda$ becomes maximum.

8. The tuning method of claim 5, wherein:

the phase control amount "$P_{M1}(\lambda)$" is permissible within 30% of change amount in the phase control necessary for switching to an adjacent resonant wavelength by changing only the phase control amount "$P_{M1}(\lambda)$", centering on a value at which light intensity with the resonant wavelength $\lambda$ becomes maximum; and the phase control amount "$P_{M2}(\lambda)$" is permissible within 30% of change amount in the phase control necessary for switching to an adjacent resonant wavelength by changing only the phase control amount "$P_{M2}(\lambda)$", centering on a value at which light intensity with the resonant wavelength $\lambda$ becomes maximum.

* * * * *